(12) United States Patent
Sasaki et al.

(10) Patent No.: US 11,094,565 B2
(45) Date of Patent: Aug. 17, 2021

(54) SUBSTRATE TREATING METHOD, SUBSTRATE TREATING LIQUID AND SUBSTRATE TREATING APPARATUS

(71) Applicant: SCREEN Holdings Co., Ltd., Kyoto (JP)

(72) Inventors: Yuta Sasaki, Kyoto (JP); Yosuke Hanawa, Kyoto (JP)

(73) Assignee: SCREEN Holdings Co., Ltd.

( * ) Notice: Subject to any disclaimer, the term of this patent is extended or adjusted under 35 U.S.C. 154(b) by 28 days.

(21) Appl. No.: 16/100,259

(22) Filed: Aug. 10, 2018

(65) Prior Publication Data

US 2019/0096704 A1  Mar. 28, 2019

(30) Foreign Application Priority Data

Sep. 25, 2017  (JP) .............................. JP2017-183415

(51) Int. Cl.
*H01L 21/67* (2006.01)
*B08B 3/10* (2006.01)
(Continued)

(52) U.S. Cl.
CPC .......... *H01L 21/67034* (2013.01); *B08B 3/10* (2013.01); *C11D 7/245* (2013.01);
(Continued)

(58) Field of Classification Search
CPC ......... B08B 3/10; B08B 7/0014; C11D 7/245; H01L 21/02057; H01L 21/67028;
(Continued)

(56) References Cited

U.S. PATENT DOCUMENTS 8,898,928 B2 * 12/2014 Sirard ............... H01L 21/02057
34/284
9,673,037 B2 *  6/2017 Sirard ............... H01L 21/02057
(Continued)

FOREIGN PATENT DOCUMENTS

JP   2011-071401 A    4/2011
JP   2012-243869 A   12/2012
(Continued)

OTHER PUBLICATIONS

JP 2014011426 A, Machine Translation (Year: 2019).*
(Continued)

*Primary Examiner* — Nadine G Norton
*Assistant Examiner* — Christopher Remavege
(74) *Attorney, Agent, or Firm* — Ostrolenk Faber LLP

(57) ABSTRACT

Disclosed is a substrate treating method of performing drying treatment on a pattern-formed surface of a substrate, the substrate treating method comprising: a supplying step of supplying a substrate treating liquid containing a plastic crystalline material in a molten state to the pattern-formed surface of the substrate; a plastic crystalline layer forming step of bringing, on the pattern-formed surface, the plastic crystalline material into a state of a plastic crystal so as to form a plastic crystalline layer; and a removing step of changing the plastic crystalline material in the state of the plastic crystal into a gas state without an intermediate phase of liquid so as to remove the plastic crystalline material from the pattern-formed surface.

7 Claims, 11 Drawing Sheets

(51) Int. Cl.
  *H01L 21/02* (2006.01)
  *H01L 21/687* (2006.01)
  *C11D 7/24* (2006.01)

(52) U.S. Cl.
  CPC .. *H01L 21/02057* (2013.01); *H01L 21/67028* (2013.01); *H01L 21/67051* (2013.01); *H01L 21/68792* (2013.01)

(58) Field of Classification Search
  CPC ......... H01L 21/67034; H01L 21/67051; H01L 21/68792
  See application file for complete search history.

(56) References Cited

U.S. PATENT DOCUMENTS

| | | | | |
|---|---|---|---|---|
| 10,304,704 | B2* | 5/2019 | Sato | H01L 21/67051 |
| 2012/0073599 | A1* | 3/2012 | Miya | B08B 7/0014 |
| | | | | 134/4 |
| 2012/0304483 | A1 | 12/2012 | Sirard et al. | 34/289 |
| 2013/0008868 | A1* | 1/2013 | Uozumi | G03F 7/162 |
| | | | | 216/41 |
| 2013/0167877 | A1* | 7/2013 | Fujiwara | B08B 3/04 |
| | | | | 134/26 |
| 2014/0179097 | A1* | 6/2014 | Hymes | H01L 21/288 |
| | | | | 438/610 |
| 2016/0025410 | A1 | 1/2016 | Igarashi et al. | |
| 2016/0071747 | A1* | 3/2016 | Uozumi | G03F 7/162 |
| | | | | 156/345.15 |
| 2017/0040154 | A1 | 2/2017 | Kagawa et al. | |
| 2017/0062244 | A1 | 3/2017 | Sato et al. | |
| 2017/0162377 | A1* | 6/2017 | Igarashi | H01L 21/02057 |
| 2017/0178892 | A1* | 6/2017 | Sato | H01L 21/02057 |
| 2017/0345683 | A1* | 11/2017 | Sasaki | H01L 21/67051 |

FOREIGN PATENT DOCUMENTS

| | | | |
|---|---|---|---|
| JP | 2013-016699 A | | 1/2013 |
| JP | 2013-258272 A | | 12/2013 |
| JP | 2014011426 A | * | 1/2014 |
| JP | 2014-523636 A | | 9/2014 |
| JP | 2015-050414 A | | 3/2015 |
| JP | 2015-142069 A | | 8/2015 |
| JP | 2015-177124 A | | 10/2015 |
| JP | 2016-025233 A | | 2/2016 |
| JP | 2017-050576 A | | 3/2017 |
| KR | 10-2012-0033220 A | | 4/2012 |
| TW | 201719743 A | | 6/2017 |

OTHER PUBLICATIONS

M.N. Patel et al., "Freeze Drying Chemistries for Wet Processing of High Aspect Ratio Structures," Proceedings of SEMATECH SPCC (Surface Preparation and Cleaning Conference), May 2015.

* cited by examiner

SUBSTRATE TREATING METHOD, SUBSTRATE TREATING LIQUID AND SUBSTRATE TREATING APPARATUS

BACKGROUND OF THE INVENTION

Field of the Invention

The present invention relates to a substrate treating method, a substrate treating liquid and a substrate treating apparatus which remove, from substrates, liquids adhered to various types of substrates such as a semiconductor substrate, a substrate for a photomask glass, a substrate for a liquid crystal display glass, a substrate for a plasma display glass, a FED (Field Emission Display) substrate, a substrate for an optical disc, a substrate for a magnetic disc and a substrate for a magneto-optical disc.

Description of Related Art

In the manufacturing process of an electronic component such as a semiconductor device or a liquid crystal display device, various types of wet processing using liquids are performed on a substrate, and thereafter drying treatment for removing the liquids adhered to the substrate in the wet processing is performed on the substrate.

As the wet processing, washing treatment which removes contaminants on the surface of the substrate can be considered. For example, on the surface of a substrate in which a fine pattern having recesses and projections is formed after a dry etching step, a reaction byproduct (etching residue) is present. In addition to the etching residue, a metal impurity, an organic contaminant and the like may be adhered to the surface of the substrate, and in order to remove these substances, washing treatment of, for example, supplying a washing liquid to the substrate is performed.

After the washing treatment, rinsing treatment to remove the washing liquid using a rinse liquid and drying treatment to dry the rinse liquid are performed. Such rinsing treatment includes, as an example, rinsing to supply a rinse liquid such as deionized water (DIW) to the substrate surface to which the washing liquid is adhered, so as to remove the washing liquid from the substrate surface. Thereafter, the drying treatment is performed to remove the rinse liquid so as to dry the substrate.

In recent years, as a finer pattern has been formed on a substrate, the aspect ratio of a projection in a pattern having recesses and projections (the ratio between the height and the width of the projection in the pattern) has been increased. Hence, there is a problem of a so-called pattern collapse in which, at the time of drying treatment, surface tension that acts on a boundary surface between a liquid such as a washing liquid or a rinse liquid in recesses in the pattern and a gas in contact with the liquid pulls and collapses the adjacent projections in the pattern.

As a drying technology for preventing such a collapse of the pattern caused by surface tension, for example, Japanese Unexamined Patent Application Publication No. 2013-16699 discloses a method wherein a solution is brought into contact with a substrate where a structure (pattern) is formed so as to change the solution into a solid form, the solid is then used as a support member for the pattern and the support member is removed by being changed from a solid phase to a gas phase without an intermediate phase of liquid. This patent literature also discloses that, at least any of a methacrylic resin material, a styrene resin material and a fluorocarbon material is used for the support member.

Japanese Unexamined Patent Application Publication Nos. 2012-243869 and 2013-258272 disclose drying technologies in which the solution of a sublimable substance is supplied onto a substrate, in which a solvent in the solution is dried so that the substrate surface is filled with the sublimable substance in a solid phase and thus the sublimable substance is sublimed. According to these patent literatures, it is assumed that, since surface tension does not apply to the boundary surface between the solid and a gas in contact with the solid, it is possible to reduce the collapse of a pattern caused by surface tension.

Japanese Unexamined Patent Application Publication No. 2015-142069 discloses a drying technology in which the melt of tertiary butanol (t-butanol) is supplied to a substrate to which a liquid is adhered, t-butanol is then solidified on the substrate so as to form a solidified body, and t-butanol is thereafter removed by sublimation.

In the drying technologies disclosed in the patent literatures described above, as compared with previous drying technologies, pattern collapse reduction can be expected to be more effective. However, in the case of a pattern which is finer and has a higher aspect ratio (in which, that is, the height of a projection in the pattern is greater than the width of the projection itself), even when the drying technologies disclosed in these patent literatures are used, the collapse of the pattern still occurs. Among a variety of causes for the occurrence of the collapse of the pattern, a force which applies between the sublimable substance and the surface of the pattern can be considered as an example.

Specifically, in a freeze drying (or sublimation drying) method utilizing sublimation, in a dry process on the surface of the substrate, the sublimable substance is changed from a solid state to a gas state without an intermediate phase of liquid. Then, on an interface between the pattern surface and the sublimable substance, forces such as an ionic bond, a hydrogen bond and a van der Waals' force act. Hence, in the sublimation drying, an uneven phase change (the solidification or the sublimation of the sublimable substance) occurs in the sublimable substance, and thus stress is applied to the pattern, with the result of the collapse of the pattern. These forces significantly depend on the physical properties of the sublimable substance. Hence, in order to reduce the occurrence of the collapse of a fine pattern caused by sublimation drying, it is necessary to select a sublimable substance suitable for the fine pattern.

Mehul N. Patel, Steve Sirard, Ratchana Limary, and Diane Hymes ("Freeze Drying Chemistries for Wet Processing of High Aspect Ratio Structures", Proceedings of SEMATECH SPCC (Surface Preparation and Cleaning Conference), May 2015) disclose that on a substrate on which a fine pattern having recesses and projections is formed, a substrate treating liquid consisted of cyclohexane is supplied, that then the substrate treating liquid is solidified at −40° C. and that the solidified substrate treating liquid is thereafter sublimed.

However, this prior art literature discloses that when cyclohexane is used as the substrate treating liquid, the collapse of a pattern cannot sufficiently be reduced.

BRIEF SUMMARY OF THE INVENTION

The present invention is made in view of the foregoing problem, and has an object to provide a substrate treating apparatus and a substrate treating method which can remove a liquid adhered to the surface of a substrate while preventing the collapse of a pattern formed on the surface of the substrate.

In order to solve the above-mentioned problems, the substrate treating method according to the present invention is a substrate treating method of performing drying treatment on a pattern-formed surface of a substrate, the substrate treating method comprising: a supplying step of supplying a substrate treating liquid containing a plastic crystalline material in a molten state to the pattern-formed surface of the substrate; a plastic crystalline layer forming step of forming a plastic crystalline layer by bringing, on the pattern-formed surface, the plastic crystalline material into a state of a plastic crystal; and a removing step of removing the plastic crystalline material from the pattern-formed surface by changing the plastic crystalline material in the state of the plastic crystal into a gas state without an intermediate phase of liquid.

In the configuration described above, at least the plastic crystalline material in the molten state is contained in the substrate treating liquid, and thus the substrate processing can be performed with a method different from the conventional freeze drying (or sublimation drying) using a sublimable substance. Specifically, in the conventional substrate treating method, for example, when a liquid is present on the pattern-formed surface of the substrate, the substrate treating liquid containing the sublimable substance is supplied to the pattern-formed surface, thereafter at least the sublimable substance is solidified into a solid state so as to form a solidified body and the solidified body is further sublimed, with the result that the liquid is removed. However, when the substrate treating liquid is solidified so as to form the solidified body, if an organic substance or the like serving as impurity is present in the substrate treating liquid containing the sublimable substance, the organic substance can serve as a crystal nucleus when the organic substance solidifies the substrate treating liquid containing the sublimable substance. In this way, the individual impurities serve as crystal nuclei such that crystal grains are grown, then the grown crystal grains collide with each other and thus crystal grain boundaries are generated in boundaries. By the generation of the crystal grain boundaries, stress is applied to the pattern, and thus the collapse of the pattern occurs.

By contrast, in the substrate treating method configured as described above, as the substrate treating liquid, the liquid is first used which contains the plastic crystalline material in the molten state. Moreover, instead of a conventional solidifying step, the plastic crystalline layer forming step is performed, bringing the plastic crystalline material into a state of the plastic crystal so as to form the plastic crystalline layer. Furthermore, the plastic crystalline material in the state of the plastic crystal is changed into the gas state without an intermediate phase of liquid so as to remove the plastic crystalline layer (removing step). Here, the state of the plastic crystal is an intermediate state between the liquid state and the solid state, which has fluidity. Hence, the plastic crystalline layer described above is formed on the pattern-formed surface, and thus it is possible to reduce the generation and growth of crystal grain boundaries. Consequently, in the configuration described above, the applying a stress caused by the generation and growth of crystal grain boundaries on the pattern is reduced, and thus it is possible to reduce the occurrence of the collapse of even a pattern which is finer and has a higher aspect ratio.

In the configuration described above, as compared with the case of the solidified body in which the substrate treating liquid containing the conventional sublimable substance is solidified, it is possible to reduce the stress exerted on the pattern. Consequently, it is possible to further reduce the occurrence of the collapse of the pattern.

In this configuration, it is preferred that in the plastic crystalline layer forming step, under atmospheric pressure, the substrate treating liquid is cooled in a temperature range which is equal to or higher than a temperature 20° C. lower than a freezing point of the plastic crystalline material and is equal to or lower than the freezing point of the plastic crystalline material.

The substrate treating liquid containing the plastic crystalline material in the molten state is cooled in the temperature range described above, and thus the plastic crystalline material is brought into the state of the plastic crystal, so that it is possible to form, on the pattern-formed surface, the plastic crystalline layer having fluidity.

In the configuration described above, in at least any one of the plastic crystalline layer forming step and the removing step, a coolant may be supplied toward a back surface on the side opposite to the pattern-formed surface of the substrate at the temperature which is equal to or higher than the temperature 20° C. lower than the freezing point of the plastic crystalline material and is equal to or lower than the freezing point of the plastic crystalline material.

In the configuration described above, in the plastic crystalline layer forming step, the coolant at the temperature which is equal to or higher than the temperature 20° C. lower than the freezing point of the plastic crystalline material and is equal to or lower than the freezing point of the plastic crystalline material is supplied toward the back surface on the side opposite to the pattern-formed surface, and thus it is possible to form the plastic crystalline layer on the pattern-formed surface. In the removing step, the coolant is supplied to the back surface, and thus it is possible to change the plastic crystalline layer into the gas state while preventing the plastic crystalline layer from being brought into the liquid state.

In the configuration described above, in at least any one of the plastic crystalline layer forming step and the removing step, a gas inert to at least the plastic crystalline material may be supplied toward the pattern-formed surface at a temperature which is equal to or higher than a temperature 20° C. lower than a freezing point of the plastic crystalline material and is equal to or lower than the freezing point of the plastic crystalline material.

In the configuration described above, in the plastic crystalline layer forming step, the inert gas at the temperature which is equal to or higher than the temperature 20° C. lower than the freezing point of the plastic crystalline material and is equal to or lower than the freezing point of the plastic crystalline material is supplied toward the pattern-formed surface, and thus it is possible to cool the plastic crystalline material so as to bring it into the state of the plastic crystal. In the removing step, the inert gas is also supplied to the plastic crystalline layer formed on the pattern-formed surface, and thus it is possible to change the plastic crystalline layer into the gas state without an intermediate phase of liquid. Since the inert gas is inert to the plastic crystalline material, the plastic crystalline material is prevented from being denatured.

In the configuration described above, in the removing step, a gas inert to at least the plastic crystalline material may be supplied toward the pattern-formed surface at a temperature which is equal to or higher than a temperature 20° C. lower than a freezing point of the plastic crystalline material and is equal to or lower than the freezing point of the plastic crystalline material, and a coolant may be supplied toward a back surface on a side opposite to the pattern-formed surface of the substrate at the temperature which is equal to or higher than the temperature 20° C. lower than the freezing point of the plastic crystalline material and is equal to or lower than the freezing point of the plastic crystalline material.

In the configuration described above, the inert gas is supplied to the plastic crystalline layer formed on the pattern-formed surface at the temperature which is equal to or higher than the temperature 20° C. lower than the freezing point of the plastic crystalline material and is equal to or lower than the freezing point of the plastic crystalline material, and thus it is possible to change the plastic crystalline layer into the gas state without an intermediate phase of liquid. The coolant is supplied to the back surface on the side opposite to the pattern-formed surface at the temperature which is equal to or lower than the freezing point of the plastic crystalline material, and thus it is possible to change the plastic crystalline layer into the gas state while preventing the plastic crystalline layer from being brought into the liquid state. Since the inert gas is inert to the sublimable substance and the solvent, the sublimable substance and the solvent are prevented from being denatured.

In the configuration described above, in at least any one of the plastic crystalline layer forming step and the removing step, the pattern-formed surface to which the substrate treating liquid is supplied or the pattern-formed surface on which the plastic crystalline layer is formed may be reduced in pressure to an environment that is lower than atmospheric pressure.

In the configuration described above, in the plastic crystalline layer forming step, the pattern-formed surface to which the substrate treating liquid is supplied is reduced in pressure to the environment that is lower than atmospheric pressure, and thus it is possible to bring the plastic crystalline material into the state of the plastic crystal so as to form the plastic crystalline layer. In the removing step, the pattern-formed surface on which the plastic crystalline layer is formed is likewise reduced in pressure to the environment that is lower than atmospheric pressure, and thus it is possible to change the plastic crystalline layer into the gas state without an intermediate phase of liquid so as to remove the plastic crystalline layer.

In this configuration, it is preferred that the plastic crystalline material is cyclohexane.

In order to solve the above-mentioned problems, the substrate treating liquid according to the present invention, which is used in processing of a substrate with a pattern-formed surface, wherein the substrate treating liquid contains a plastic crystalline material in a molten state, and the substrate treating liquid is used in a state of a plastic crystal without being solidified under a condition of a temperature which is equal to or higher than a temperature 20° C. lower than a freezing point of the plastic crystalline material and is equal to or lower than the freezing point.

In the configuration described above, at least the plastic crystalline material in the molten state is contained in the substrate treating liquid, and thus the substrate processing can be performed with a method different from the conventional freeze drying (or sublimation drying) using a sublimable substance. Specifically, the plastic crystalline material is contained in the substrate treating liquid, and is used under a condition of the temperature which is equal to or higher than the temperature 20° C. lower than the freezing point of the plastic crystalline material and is equal to or lower than the freezing point, and thus the substrate processing can be performed, without the substrate treating liquid being solidified, with the substrate treating liquid in the state of the plastic crystal. Here, the state of the plastic crystal is an intermediate state between the liquid state and the solid state so as to have fluidity. Hence, the plastic crystalline material is brought into the state of the plastic crystal instead of the solid state, and thus it is possible to reduce crystal grain boundaries generated when the conventional sublimable substance is used so as to perform the solidification and the growth thereof. Consequently, in the configuration described above, stress caused by the generation and growth of crystal grain boundaries is prevented from being applied to the pattern, and thus it is possible to prevent the collapse of even a pattern which is fine and has a high aspect ratio. In the configuration described above, it is possible to remove the stress itself exerted on the pattern by the solidification of the substrate treating liquid, and thus it is possible to further reduce the occurrence of the collapse of the pattern.

In this configuration, it is preferred that the plastic crystalline material is cyclohexane.

In order to solve the above-mentioned problems, the substrate treating apparatus according to the present invention is a substrate treating apparatus that is used in a substrate treating method including: a supplying step of supplying a substrate treating liquid containing a plastic crystalline material in a molten state to a pattern-formed surface of a substrate, a plastic crystalline layer forming step of bringing, on the pattern-formed surface, the plastic crystalline material into a state of a plastic crystal so as to form a plastic crystalline layer and a removing step of changing the plastic crystalline material in the state of the plastic crystal into a gas state without an intermediate phase of liquid so as to remove the plastic crystalline material from the pattern-formed surface, wherein the substrate treating apparatus includes a supplying unit adapted for supplying the substrate treating liquid to the pattern-formed surface of the substrate, a plastic crystalline layer forming unit adapted for forming the plastic crystalline layer on the pattern-formed surface by bringing the plastic crystalline material into the state of the plastic crystal and a removing unit adapted for removing the plastic crystalline material from the pattern-formed surface by changing the plastic crystalline material in the state of the plastic crystal into the gas state without the intermediate phase of liquid.

In the configuration described above, at least the plastic crystalline material in the molten state is contained in the substrate treating liquid, and thus it is possible to provide a substrate treating apparatus which can perform the substrate processing with a method different from the conventional freeze drying (or sublimation drying) using a sublimable substance. Specifically, in the conventional substrate treating apparatus, for example, when a liquid is present on the pattern-formed surface of the substrate, the substrate treating liquid containing the sublimable substance is supplied with a supplying unit to the pattern-formed surface, thereafter at least the sublimable substance is solidified with a solidifying unit into a solid state so as to form a solidified body and the solidified body is further sublimed with a subliming unit, with the result that the liquid is removed. However, when the substrate treating liquid is solidified so as to form the solidified body, if an organic substance the like serving as impurity is present in the substrate treating liquid containing the sublimable substance, the organic substance can serve as a crystal nucleus when the organic substance solidifies the substrate treating liquid containing the sublimable substance. In this way, the individual impurities serve as crystal nuclei such that crystal grains are grown, then the grown crystal grains collide with each other and thus crystal grain boundaries are generated in boundaries. By the generation of the crystal grain boundaries, stress is applied to the pattern, and thus the collapse of the pattern occurs.

By contrast, in the substrate treating apparatus configured as described above, as the substrate treating liquid, the liquid is first used which contains the plastic crystalline material in the molten state. Moreover, instead of a conventional solidifying unit, the plastic crystalline layer forming unit for bringing the plastic crystalline material into state of the plastic crystal so as to form the plastic crystalline layer is included. Furthermore, a removing unit is included which changes the plastic crystalline material in the state of the plastic crystal into the gas state without an intermediate phase of liquid so as to remove the plastic crystalline layer. Here, the state of the plastic crystal is an intermediate state between the liquid state and the solid state so as to have fluidity. Hence, the plastic crystalline layer described above is formed on the pattern-formed surface, and thus it is possible to reduce the generation and growth of crystal grain boundaries. Consequently, in the configuration described above, the act of stress caused by the generation and growth of crystal grain boundaries on the pattern is reduced, and thus it is possible to reduce the occurrence of the collapse of even a pattern which is fine and has a high aspect ratio.

In the configuration described above, as compared with the case of the solidified body in which the substrate treating liquid containing the conventional sublimable substance is solidified, it is possible to reduce the stress exerted on the pattern. Consequently, it is possible to further reduce the occurrence of the collapse of the pattern.

The present invention has effects which will be described below by the units described above.

Specifically, in the present invention, for example, when a liquid is present on the pattern-formed surface of the substrate, the liquid is replaced by the substrate treating liquid containing the plastic crystalline material, thereafter the plastic crystalline material is brought into the state of the plastic crystal so as to form the plastic crystalline layer and then the plastic crystalline layer is changed into the gas state without an intermediate phase of liquid. Hence, it is possible to reduce the collapse of the pattern caused by the generation of crystal grain boundaries. Since the plastic crystalline layer in which the plastic crystalline material is brought into the state of the plastic crystal has fluidity, as compared with the case where the sublimable substance is formed into the solidified body, it is possible to reduce the application of stress to the pattern. Consequently, in the present invention, it is possible to provide the substrate treating method, the substrate treating liquid and the substrate treating apparatus which can further reduce the collapse of the pattern with a method different from the conventional freeze drying (or sublimation drying) using a sublimable substance.

DETAILED DESCRIPTION OF THE INVENTION

First Embodiment

A first embodiment of the present invention will be described below.

A substrate treating apparatus according to the present embodiment can be used, for example, for processing on various types of substrates. The "substrates" described above refer to various types of substrates such as a semiconductor substrate, a substrate for a photomask glass, a substrate for a liquid crystal display glass, a substrate for a plasma display glass, a FED (Field Emission Display) substrate, a substrate for an optical disc, a substrate for a magnetic disc and a substrate for a magneto-optical disc. In the present embodiment, a description will be given using, as an example, a case where the substrate treating apparatus 1 is used for processing on a semiconductor substrate (hereinafter referred to as a "substrate").

A substrate is considered here, as an example of the substrate, in which a circuit pattern and the like (hereinafter referred to as a "pattern") are formed on only one main surface. Here, a pattern-formed surface (main surface) on which the pattern is formed is referred to as a "front surface", and a main surface on the opposite side on which the pattern is not formed is referred to as a "back surface". The surface of the substrate which is directed downward is referred to as a "lower surface", and the surface of the substrate which is directed upward is referred to as an "upper surface". A description will be given below with the assumption that the upper surface is the front surface. In the present specification, the "pattern-formed surface" means a surface in which a concave-convex pattern is formed in an arbitrary region in the substrate regardless of the surface with a planar shape, a curved shape or a concave-convex shape.

The substrate treating apparatus is a single-wafer type substrate treating apparatus which is used in washing treatment (including rinsing treatment) for removing contaminants such as particles adhered to the substrate and drying treatment after the washing treatment.

<1-1 Configuration of Substrate Treating Apparatus>

The configuration of the substrate treating apparatus according to the present embodiment will first be described with reference to FIGS. 1 to 3.

Figure 1:
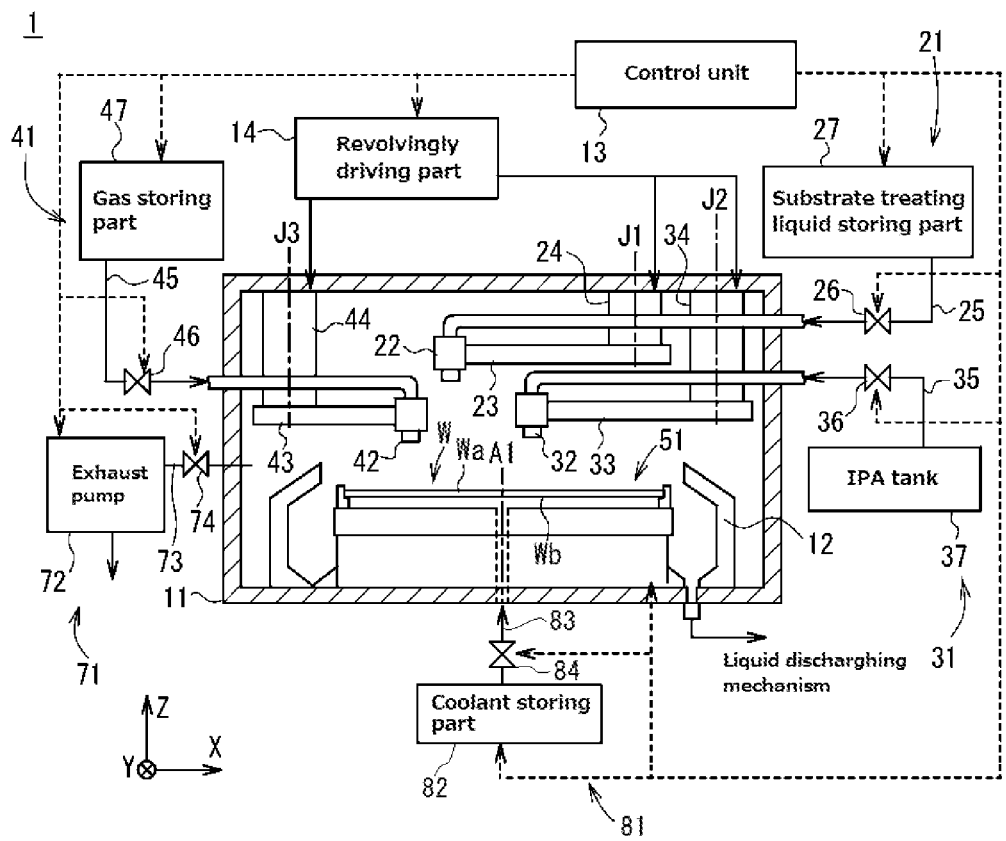
FIG. 1 is an illustrative diagram schematically showing a substrate treating apparatus according to a first embodiment of the present invention.

FIG. 1 is an illustrative diagram schematically showing the substrate treating apparatus according to the present embodiment. FIG. 2 is a schematic plan view showing the internal configuration of the substrate treating apparatus. FIG. 3 is a schematic cross-sectional view schematically showing a substrate holder in the substrate treating apparatus. In individual figures, in order to clarify the relationship of directions shown in the figures, XYZ orthogonal coordinate axes are shown as necessary. In FIGS. 1 and 2, an XY plane indicates a horizontal plane, and a+Z direction indicates a vertically upward direction.

As shown in FIG. 1, the substrate treating apparatus 1 includes at least a chamber 11 which is a container for storing the substrate W, a substrate holder 51 which holds the substrate W, a control unit 13 which controls the individual portions of the substrate treating apparatus 1, a substrate treating liquid supplying unit (supplying unit) 21 which supplies a substrate treating liquid to the front surface Wa of the substrate W, an IPA supplying unit 31 which supplies IPA to the front surface Wa of the substrate W, a gas supplying unit (plastic crystalline layer forming unit, removing unit) 41 which supplies a gas to the front surface Wa of the substrate W, a scattering prevention cup 12 which collects the IPA, the substrate treating liquid and the like, a revolvingly driving part 14 which individually and independently turns and drives arms to be described later, a pressure reducing unit (removing unit) 71 which reduces the pressure within the chamber 11 and a coolant supplying unit (plastic crystalline layer forming unit, removing unit) 81 which supplies a coolant to the back surface Wb of the substrate W. The substrate treating apparatus 1 also includes a substrate carrying-in/out unit, a chuck pin opening/closing mechanism and a wet washing unit (all of which are not illustrated). The individual portions of the substrate treating apparatus 1 will be described below. Although in FIGS. 1 and 2, only portions used in the drying treatment are shown and a washing nozzle and the like used in the washing treatment are not shown, the substrate treating apparatus 1 may include the nozzle and the like.

Figure 3:
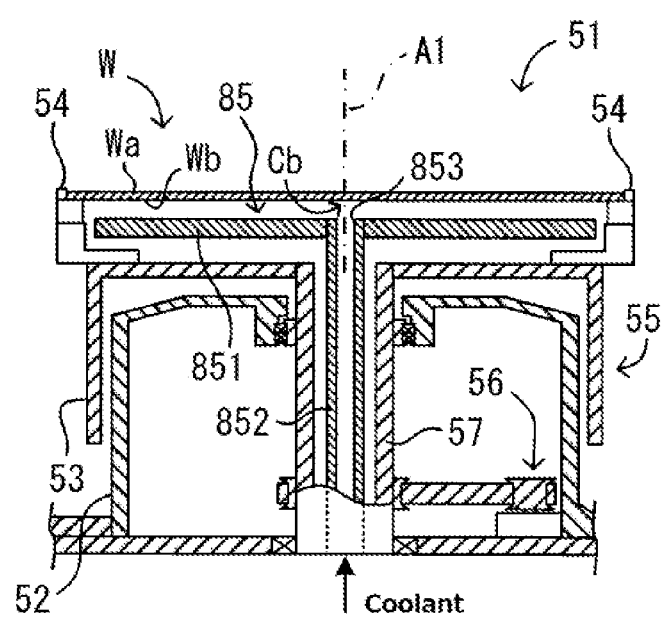
FIG. 3 is a schematic cross-sectional view schematically showing a substrate holder in the substrate treating apparatus.

The substrate holder 51 is a unit which holds the substrate W, and, as shown in FIG. 3, holds the substrate W in a substantially horizontal posture in a state where the front surface Wa of the substrate is directed upward and rotates the substrate W. The substrate holder 51 includes a spin chuck 55 in which a spin base 53 and a rotation support shaft 57 are integrally coupled. The spin base 53 is formed substantially in the shape of a circle in plan view, and the hollow rotation support shaft 57 which is extended in a substantially vertical direction is fixed to the center portion thereof. The rotation support shaft 57 is coupled to the rotation shaft of a chuck rotation mechanism 56 which includes a motor. The chuck rotation mechanism 56 is stored within a cylindrical casing 52, and the rotation support shaft 57 is supported by the casing 52 so as to be freely rotated about the rotation shaft in the vertical direction.

The chuck rotation mechanism 56 rotates the rotation support shaft 57 about the rotation shaft by drive from a chuck drive portion (unillustrated) in the control unit 13. In this way, the spin base 53 attached to an upper end portion of the rotation support shaft 57 is rotated about the rotation shaft. The control unit 13 controls the chuck rotation mechanism 56 through the check drive portion, and thereby can adjust the rotation speed of the spin base 53.

In the vicinity of the peripheral portion of the spin base 53, a plurality of chuck pins 54 for grasping the peripheral end portion of the substrate W are provided so as to stand. Although the number of chuck pins 54 installed is not particularly limited, at least three or more chuck pins 54 are preferably provided in order to reliably hold the circular substrate W. In the present embodiment, along the peripheral portion of the spin base 53, three chuck pins 54 are arranged at equal intervals (see FIG. 2). Each of the chuck pins 54 includes a substrate support pin which supports the peripheral portion of the substrate W from below and a substrate hold pin which presses the outer circumferential end surface of the substrate W supported by the substrate support pin so as to hold the substrate W.

Each of the chuck pins 54 can be switched between a pressed state where the substrate hold pin presses the outer circumferential end surface of the substrate W and a released state where the substrate hold pin is separated from the outer circumferential end surface of the substrate W, and the switching of the states is performed according to an operation instruction from the control unit 13 which controls the entire device. More specifically, when the substrate W is loaded or unloaded with respect to the spin base 53, the individual chuck pins 54 are brought into the released state whereas when substrate processing to be described later from the washing treatment to the removal treatment is performed on the substrate W, the individual chuck pins 54 are brought into the pressed state. When the chuck pin 54 is brought into the pressed state, the chuck pin 54 grasps the peripheral portion of the substrate W such that the substrate W is held in a horizontal posture (XY plane) a predetermined distance apart from the spin base 53. In this way, the substrate W is held horizontally in a state where its front surface Wa is directed upward. A method of holding the substrate W is not limited to this method, and for example, the back surface Wb of the substrate W may be held by an adsorption method with a spin chuck or the like.

In a state where the substrate W is held by the spin chuck 55, more specifically, in a state where the peripheral portion of the substrate W is held by the chuck pins 54 provided on the spin base 53, the chuck rotation mechanism 56 is operated, and thus the substrate W is rotated about the rotation shaft A1 in the vertical direction.

The process liquid supplying unit (supplying unit) 21 is a unit which supplies the substrate treating liquid to the pattern-formed surface of the substrate W held in the substrate holder 51, and includes, as shown in FIG. 1, at least a nozzle 22, an arm 23, a turning shaft 24, a pipe 25, a valve 26 and a substrate treating liquid storing part 27.

Figure 4A:
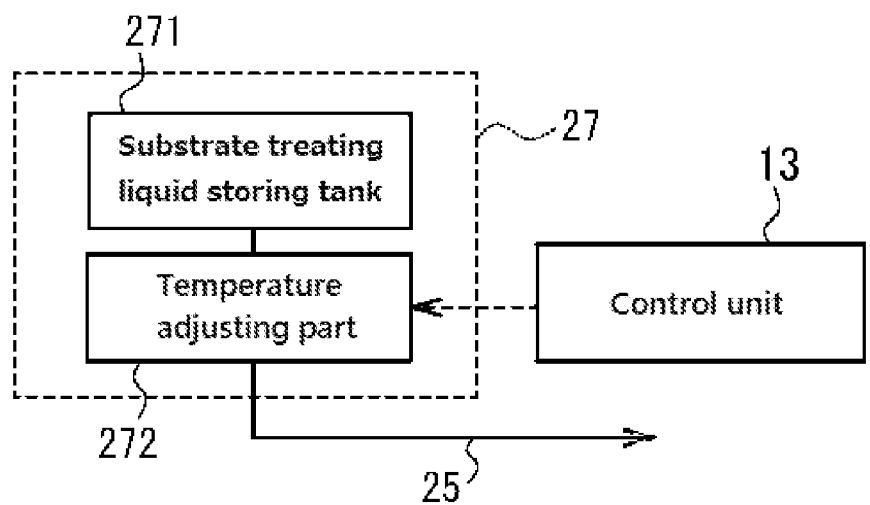
FIG. 4A is a block diagram showing a schematic configuration of a substrate treating liquid storing part in the substrate treating apparatus.
Figure 4B:
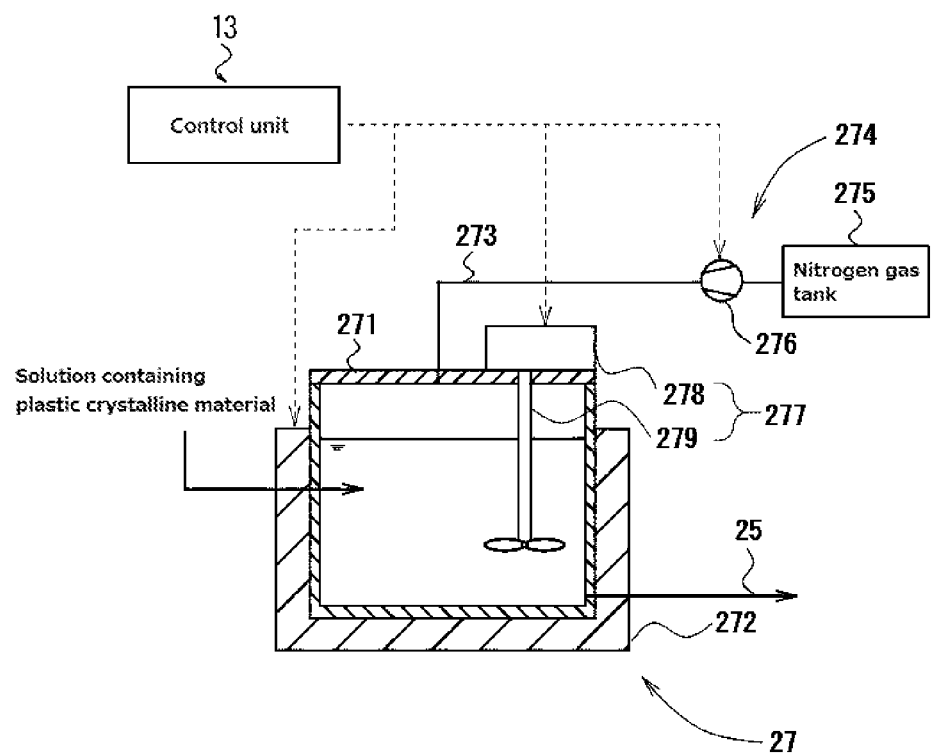
FIG. 4B is an illustrative diagram showing a specific configuration of the substrate treating liquid storing part.

As shown in FIGS. 4A and 4B, the substrate treating liquid storing part 27 includes at least a substrate treating liquid storing tank 271, an agitation part 277 which agitates the substrate treating liquid within the substrate treating liquid storing tank 271, a pressurization part 274 which pressurizes the substrate treating liquid storing tank 271 so as to feed out the substrate treating liquid and a temperature adjusting part 272 which heats the substrate treating liquid within the substrate treating liquid storing tank 271. FIG. 4A is a block diagram showing a schematic configuration of the substrate treating liquid storing part 27, and FIG. 4B is an illustrative diagram showing a specific configuration of the substrate treating liquid storing part 27.

The agitation part 277 includes a rotation part 279 which agitates the substrate treating liquid within the substrate treating liquid storing tank 271 and an agitation control part 278 which controls the rotation of the rotation part 279. The agitation control part 278 is electrically connected to the control unit 13. The rotation part 279 has a propeller-shaped agitation blade at a tip end of the rotation shaft (the lower end of the rotation part 279 in FIG. 4B), the control unit 13 provides an operation instruction to the agitation control part 278 such that the rotation part 279 is rotated, and thus the substrate treating liquid is agitated by the agitation blade, with the result that the concentration and temperature of a plastic crystalline material (details of which will be described later) and the like in the substrate treating liquid are made uniform.

The method of making the concentration and temperature of the substrate treating liquid within the substrate treating liquid storing tank 271 uniform is not limited to the method described above, and a known method such as a method of additionally providing a circulation pump to circulate the substrate treating liquid can be used.

The pressurization part 274 is formed with a nitrogen gas tank 275 which is the supply source of a gas for pressurizing the interior of the substrate treating liquid storing tank 271, a pump 276 which pressurizes nitrogen gas and a pipe 273. The nitrogen gas tank 275 is connected through the pipe 273 with the pipeline to the substrate treating liquid storing tank 271, and the pump 276 is interposed in the pipe 273.

The temperature adjusting part 272 is electrically connected to the control unit 13, and heats, by the operation instruction of the control unit 13, the substrate treating liquid stored in the substrate treating liquid storing tank 271 so as to perform temperature adjustment. The temperature adjustment is preferably performed such that the temperature of the substrate treating liquid is equal to or above the melting point of the plastic crystalline material contained in the substrate treating liquid. In this way, when the substrate treating liquid contains the plastic crystalline material in a molten state, it is possible to maintain the molten state of the plastic crystalline material. The upper limit of the temperature adjustment is preferably a temperature which is lower than the boiling point. The temperature adjusting part 272 is not particularly limited, and for example, a known temperature adjustment mechanism can be used such as a resistance heater, a Peltier element or a pipe through which water whose temperature is adjusted is passed. In the present embodiment, the configuration of the temperature adjusting part 272 is arbitrary. For example, when the substrate treating liquid contains the plastic crystalline material in the molten state, and an environment in which the substrate treating apparatus 1 is installed is an environment whose temperature is higher than the melting point of the plastic crystalline material, since it is possible to maintain the molten state of the plastic crystalline material, it is not necessary to heat the substrate treating liquid. Consequently, the temperature adjusting part 272 can be omitted.

The substrate treating liquid storing part 27 (more specifically, the substrate treating liquid storing tank 271) is connected through the pipe 25 with the pipeline to the nozzle 22, and the valve 26 is interposed partway through the path of the pipe 25.

An air pressure sensor (unillustrated) is provided within the substrate treating liquid storing tank 271, and is electrically connected to the control unit 13. The control unit 13 controls, based on a value detected by the air pressure sensor, the operation of the pump 276 so as to keep the air pressure within the substrate treating liquid storing tank 271 at a predetermined air pressure higher than atmospheric pressure. On the other hand, the valve 26 is also electrically connected to the control unit 13, and is normally closed. The opening and closing of the valve 26 is also controlled by the operation instruction of the control unit 13. When the control unit 13 provides the operation instruction to the substrate treating liquid supplying unit 21 so as to open the valve 26, the substrate treating liquid is fed by pressure from the interior of the substrate treating liquid storing tank 271 which is pressurized, and is discharged through the pipe 25 from the nozzle 22. In this way, it is possible to supply the substrate treating liquid to the front surface Wa of the substrate W. Since the substrate treating liquid storing tank 271 uses, as described above, the pressure caused by the nitrogen gas to feed the substrate treating liquid, the substrate treating liquid storing tank 271 is preferably configured so as to be airtight.

The nozzle 22 is attached to the tip end portion of the arm 23 which is provided so as to be extended horizontally, and is arranged above the spin base 53. The back end portion of the arm 23 is supported by the turning shaft 24 provided so as to be extended in the Z direction such that back end portion of the arm 23 is freely rotated about an axis J1, and the turning shaft 24 is provided so as to be fixed within the chamber 11. The arm 23 is coupled through the turning shaft 24 to the revolvingly driving part 14. The revolvingly driving part 14 is electrically connected to the control unit 13, and turns the arm 23 about the axis J1 by the operation instruction from the control unit 13. As the arm 23 is turned, the nozzle 22 is also moved.

Figure 2:
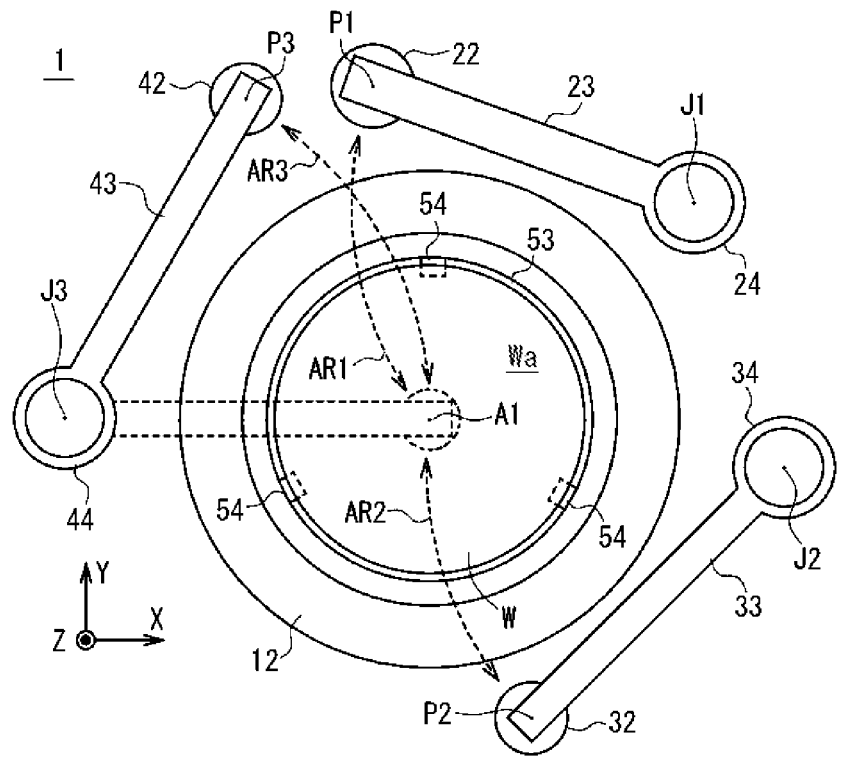
FIG. 2 is a schematic plan view showing the substrate treating apparatus.

As indicated by solid lines in FIG. 2, the nozzle 22 is normally located outside the peripheral portion of the substrate W, and is arranged in a retraction position P1 outside the scattering prevention cup 12. When the arm 23 is turned by the operation instruction of the control unit 13, the nozzle 22 is moved along the path of an arrow AR1 so as to be arranged in a position above the center portion (the axis A1 or the vicinity thereof) of the front surface Wa of the substrate W.

As shown in FIG. 1, the IPA supplying unit 31 is a unit which supplies the IPA (isopropyl alcohol) to the substrate W held in the substrate holder 51, and includes a nozzle 32, an arm 33, a turning shaft 34, a pipe 35, a valve 36 and an IPA tank 37.

The IPA tank 37 is connected through the pipe 35 with the pipeline to the nozzle 32, and the valve 36 is interposed partway through the path of the pipe 35. In the IPA tank 37, the IPA is stored, the IPA within the IPA tank 37 is pressurized by an unillustrated pressurization unit and thus the IPA is fed from the pipe 35 in the direction of the nozzle 32.

The valve 36 is electrically connected to the control unit 13, and is normally closed. The opening and closing of the valve 36 is controlled by the operation instruction of the control unit 13. When the valve 36 is opened by the operation instruction of the control unit 13, the IPA is passed through the pipe 35 and is supplied from the nozzle 32 to the front surface Wa of the substrate W.

The nozzle 32 is attached to the tip end portion of the arm 33 which is provided so as to be extended horizontally, and is arranged above the spin base 53. The back end portion of the arm 33 is supported by the turning shaft 34 provided so as to be extended in the Z direction such that the back end portion of the arm 33 is freely rotated about an axis J2, and the turning shaft 34 is provided so as to be fixed within the chamber 11. The arm 33 is coupled through the turning shaft 34 to the revolvingly driving part 14. The revolvingly driving part 14 is electrically connected to the control unit 13, and turns the arm 33 about the axis J2 by the operation instruction from the control unit 13. As the arm 33 is turned, the nozzle 32 is also moved.

As indicated by solid lines in FIG. 2, the nozzle 32 is normally located outside the peripheral portion of the substrate W, and is arranged in a retraction position P2 outside the scattering prevention cup 12. When the arm 33 is turned by the operation instruction of the control unit 13, the nozzle 32 is moved along the path of an arrow AR2 so as to be arranged in a position above the center portion (the axis A1 or the vicinity thereof) of the front surface Wa of the substrate W.

Although in the present embodiment, IPA is used in the IPA supplying unit 31, as long as a liquid is used which is soluble in the plastic crystalline material and deionized water (DIW), in the present invention, there is no limitation to IPA. Examples of a replacement of the IPA in the present embodiment include methanol, ethanol, acetone, benzene, carbon tetrachloride, chloroform, hexane, decalin, tetralin, acetic acid, cyclohexanol, ether and hydrofluoroether.

As shown in FIG. 1, the gas supplying unit 41 is a unit which supplies a gas to the substrate W held in the substrate holder 51, and includes a nozzle 42, an arm 43, a turning shaft 44, a pipe 45, a valve 46 and a gas storing part 47.

Figure 5:
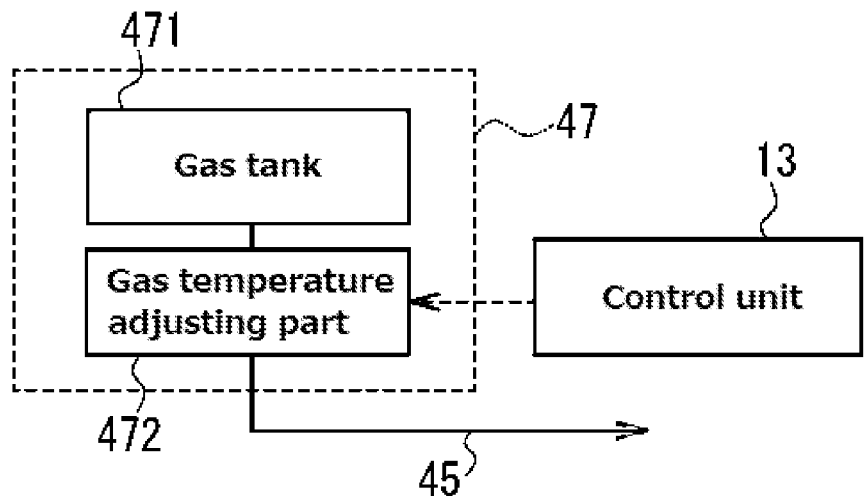
FIG. 5 is a block diagram showing a schematic configuration of a gas storing part in the substrate treating apparatus.

As shown in FIG. 5, the gas storing part 47 includes a gas tank 471 which stores a gas and a gas temperature adjusting part 472 which adjusts the temperature of the gas stored in the gas tank 471. This figure is a block diagram showing a schematic configuration of the gas storing part 47. The gas temperature adjusting part 472 is electrically connected to the control unit 13, and heats or cools the gas stored in the gas tank 471 by the operation instruction of the control unit 13 so as to perform temperature adjustment. The temperature adjustment is preferably performed such that the gas stored in the gas tank 471 has a low temperature which is equal to or higher than a temperature 20° C. lower than the freezing point of the plastic crystalline material and is equal to or lower than the freezing point of the plastic crystalline material. The gas temperature adjusting part 472 is not particularly limited, and for example, a known temperature adjustment mechanism can be used such as a Peltier element or a pipe through which water whose temperature is adjusted is passed.

As shown in FIG. 1, the gas storing part 47 (more specifically, the gas tank 471) is connected through the pipe 45 with the pipeline to the nozzle 42, and the valve 46 is interposed partway through the path of the pipe 45. The gas within the gas storing part 47 is pressurized by an unillustrated pressurization unit so as to be fed to the pipe 45. Since the pressurization unit can be realized by pressurization with a pump or the like or by compressing and storing the gas into the gas storing part 47, any pressurization unit may be used.

The valve 46 is electrically connected to the control unit 13, and is normally closed. The opening and closing of the valve 46 is controlled by the operation instruction of the control unit 13. When the valve 46 is opened by the operation instruction of the control unit 13, the gas is passed through the pipe 45 and is supplied from the nozzle 42 to the front surface Wa of the substrate W.

The nozzle 42 is attached to the tip end portion of the arm 43 which is provided so as to be extended horizontally, and is arranged above the spin base 53. The back end portion of the arm 43 is supported by the turning shaft 44 provided so as to be extended in the Z direction such that the back end portion of the arm 43 is freely rotated about an axis J3, and the turning shaft 44 is provided so as to be fixed within the chamber 11. The arm 43 is coupled through the turning shaft 44 to the revolvingly driving part 14. The revolvingly driving part 14 is electrically connected to the control unit 13, and turns the arm 43 about the axis J3 by the operation instruction from the control unit 13. As the arm 43 is turned, the nozzle 42 is also moved.

As indicated by solid lines in FIG. 2, the nozzle 42 is normally located outside the peripheral portion of the substrate W, and is arranged in a retraction position P3 outside the scattering prevention cup 12. When the arm 43 is turned by the operation instruction of the control unit 13, the nozzle 42 is moved along the path of an arrow AR3 so as to be arranged in a position above the center portion (the axis A1 or the vicinity thereof) of the front surface Wa of the substrate W. How the nozzle 42 is arranged in the position above the center portion of the front surface Wa is indicated by dotted lines in FIG. 2.

In the gas tank 471, an inert gas which is inert to at least the plastic crystalline material, more specifically, nitrogen gas, is stored. The nitrogen gas stored is adjusted in the gas temperature adjusting part 472 such that its temperature is equal to or higher than a temperature 20° C. lower than the freezing point of the plastic crystalline material and is equal to or lower than the freezing point of the plastic crystalline material and that its temperature is preferably equal to or higher than a temperature 5° C. lower than the freezing point of the plastic crystalline material and is equal to or lower than the freezing point of the plastic crystalline material. The temperature of the nitrogen gas is not particularly limited as long as the temperature is equal to or higher than the temperature 20° C. lower than the freezing point of the plastic crystalline material and is equal to or lower than the freezing point of the plastic crystalline material, and the temperature of the nitrogen gas can be normally set within a range which is equal to or higher than the temperature 5° C. lower than the freezing point and is equal or lower than room temperature. The temperature of the nitrogen gas is set equal to or higher than 15° C., and thus it is possible to prevent water vapor present within the chamber 11 from being solidified and adhered to the front surface Wa of the substrate W, with the result that it is possible to prevent the substrate W from being adversely affected.

The nitrogen gas used in the present embodiment is preferably a dry gas whose dew point is equal to or lower than the freezing point of the plastic crystalline material. When the nitrogen gas is sprayed to a plastic crystalline layer (details of which will be described later) under an atmospheric pressure environment, the plastic crystalline material in the plastic crystalline layer is changed into a gas state in the nitrogen gas without an intermediate phase of liquid. Since the nitrogen gas is continuously supplied to the plastic crystalline layer, the partial pressure of the plastic crystalline material in the gas state produced in the nitrogen gas is kept lower than the saturated vapor pressure of the plastic crystalline material in the gas state at the temperature of the nitrogen gas, and thus at least the surface of the plastic crystalline layer is filled under an atmosphere in which the plastic crystalline material is present in the gas state at or below the saturated vapor pressure.

Although in the present embodiment, as the gas supplied by the gas supplying unit 41, nitrogen gas is used, as long as the gas is inert to the plastic crystalline material, there is no limitation to the gas in the practice of the present invention. Examples of a replacement of the nitrogen gas in the first embodiment include argon gas, helium gas and air (a mixture gas of 80% of nitrogen and 20% of oxygen). Alternatively, a mixture gas obtained by mixing a plurality of types of gases described above may be used.

As shown in FIG. 1, the pressure reducing unit 71 is a unit which reduces the interior of the chamber 11 in pressure to an environment lower than atmospheric pressure, and includes an exhaust pump 72, a pipe 73 and a valve 74. The exhaust pump 72 is a known pump which is connected through the pipe 73 with the pipeline to the chamber 11 and which applies pressure to the gas. The exhaust pump 72 is electrically connected to the control unit 13, and is normally in a stop state. The drive of the exhaust pump 72 is controlled by the operation instruction of the control unit 13. The valve 74 is interposed in the pipe 73. The valve 74 is electrically connected to the control unit 13, and is normally closed. The opening and closing of the valve 74 is controlled by the operation instruction of the control unit 13.

When the exhaust pump 72 is driven by the operation instruction of the control unit 13, and the valve 74 is opened, the gas present within the chamber 11 is exhausted by the exhaust pump 72 through the pipe 73 to the outside of the chamber 11.

The scattering prevention cup 12 is provided so as to surround the spin base 53. The scattering prevention cup 12 is connected to an unillustrated raising/lowering mechanism so as to be able to be raised and lowered in the Z direction. When the substrate treating liquid and the IPA are supplied to the pattern-formed surface of the substrate W, the scattering prevention cup 12 is located by the raising/lowering mechanism in a predetermined position as shown in FIG. 1 so as to surround, from lateral positions, the substrate W held by the chuck pins 54. In this way, it is possible to collect liquids such as the substrate treating liquid and the IPA scattered from the substrate W and the spin base 53.

A coolant supplying unit 81 is a unit which supplies the coolant to the back surface Wb of the substrate W and which forms part of the plastic crystalline layer forming unit and the removing unit in the present invention. More specifically, the coolant supplying unit 81 includes, as shown in FIGS. 1 and 3, at least a coolant storing part 82, a pipe 83, a valve 84 and a coolant supply part 85.

Figure 6:
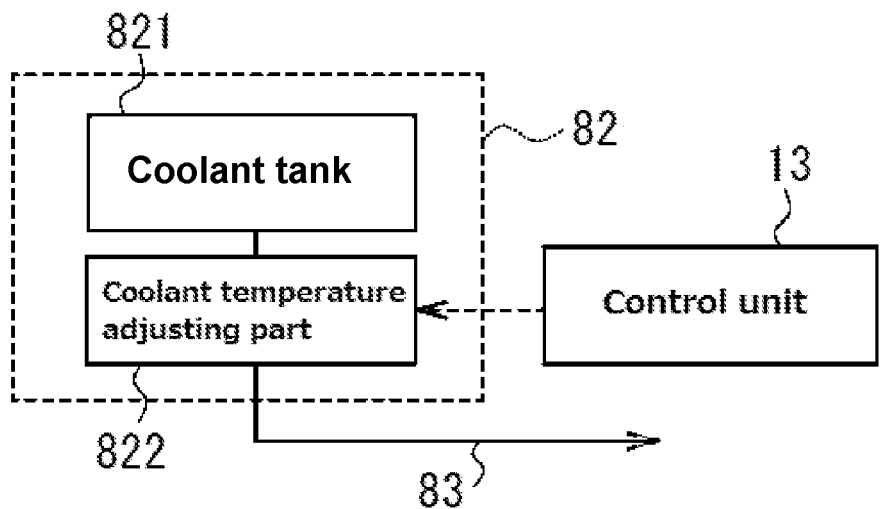
FIG. 6 is a block diagram showing a schematic configuration of a coolant storing part in the substrate treating apparatus.

As shown in FIG. 6, the coolant storing part 82 includes a coolant tank 821 which stores the coolant and a coolant temperature adjusting part 822 which adjusts the temperature of the coolant stored in the coolant tank 821. FIG. 6 is a block diagram showing a schematic configuration of the coolant storing part 82.

The coolant temperature adjusting part 822 is electrically connected to the control unit 13, and heats or cools the coolant stored in the coolant tank 821 by the operation instruction of the control unit 13 so as to perform temperature adjustment. The temperature adjustment is preferably performed such that the coolant stored in the coolant tank 821 has a low temperature which is equal to or higher than the temperature 20° C. lower than the freezing point of the plastic crystalline material and is equal to or lower than the freezing point of the plastic crystalline material. The coolant temperature adjusting part 822 is not particularly limited, and for example, a known temperature adjustment mechanism can be used such as a chiller using a Peltier element or a pipe through which water whose temperature is adjusted is passed.

The coolant storing part 82 is connected through the pipe 83 to the coolant supply part 85, and the valve 84 is interposed partway through the path of the pipe 83. The coolant within the coolant storing part 82 is pressurized by an unillustrated pressurization unit so as to be fed to the pipe 83. Since the pressurization unit can be realized by pressurization with a pump or the like or by compressing and storing the gas into the coolant storing part 82, any pressurization unit may be used.

The valve 84 is electrically connected to the control unit 13, and is normally closed. The opening and closing of the valve 84 is controlled by the operation instruction of the control unit 13. When the valve 84 is opened by the operation instruction of the control unit 13, the coolant is passed through the pipe 83 and is supplied through the coolant supply part 85 to the back surface Wb of the substrate W.

The coolant supply part 85 is provided below the substrate W supported by the spin chuck 55 in a horizontal posture. As shown in FIG. 3, the coolant supply part 85 includes at least an opposite member 851 whose horizontal upper surface is arranged opposite the back surface Wb of the substrate W, the supply pipe 852 which is attached to the center portion of the opposite member 851 and which is extended downward in the vertical direction and a discharge portion 853 which discharges the coolant in a fluid state toward the back surface Wb of the substrate W.

The opposite member 851 has a disc-shaped external form whose area is lower than the substrate W. The opposite member 851 is provided so as to be separated only an arbitrary distance apart from the substrate W. The separation distance between the opposite member 851 and the substrate W is not particularly limited, and is preferably set as necessary so as to be filled with the coolant.

The supply pipe 852 is inserted through the center portion of the hollow rotation support shaft 57. The discharge portion 853 is opened, in the supply pipe 852, toward the center portion Cb of the back surface Wb of the substrate W, and discharges the coolant supplied from the coolant storing part 82 toward the back surface Wb of the substrate W. The area of the opening of the discharge portion 853 is not particularly limited, and can be set as necessary with consideration given to the discharged amount and the like. The supply pipe 852 is not connected to the rotation support shaft 57, and thus even when the spin chuck 55 is rotated, the discharge portion 853 is prevented from being rotated.

As the coolant, a liquid or a gas can be utilized whose temperature is equal to or higher than the temperature 20° C. lower than the freezing point of the plastic crystalline material and is equal to or lower than the freezing point of the plastic crystalline material and whose temperature is preferably equal to or higher than the temperature 5° C. lower than the freezing point of the plastic crystalline material and is equal to or lower than the freezing point of the plastic crystalline material. Furthermore, as the liquid, there is no particular limitation, and for example, cold water or the like at a predetermined temperature can be utilized. As the gas, there is no particular limitation, and a gas which is inert to the plastic crystalline material, and more specifically, nitrogen gas or the like at a predetermined temperature can be utilized.

Figure 7:
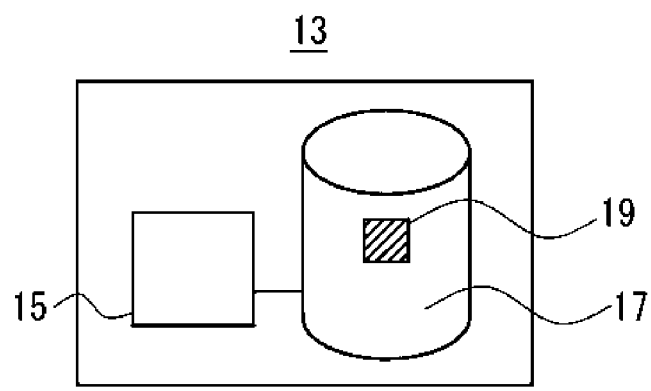
FIG. 7 is an illustrative diagram showing a schematic configuration of a control unit in the substrate treating apparatus.

The control unit 13 is electrically connected to the individual portions of the substrate treating apparatus 1 (see FIG. 1), and controls the operations of the individual portions. FIG. 7 is a schematic view showing the configuration of the control unit 13. As shown in FIG. 7, the control unit 13 is formed with a computer which includes a computation processing part 15 and a memory 17. As the computation processing part 15, a CPU which performs various types of computation processing is used. The memory 17 includes a ROM which is a read-only memory for storing basic programs, a RAM which is a readable and writable memory for storing various types of information and a magnetic disc for storing control software, data and the like. In the magnetic disc, substrate processing conditions (recipes) corresponding to the substrate W are previously stored. The CPU reads the substrate processing conditions on the RAM so as to control the individual portions of the substrate treating apparatus 1 according to the details thereof.

<1-2 Substrate Treating Liquid>

The process liquid used in the present embodiment will then be described below.

The substrate treating liquid of the present embodiment contains the plastic crystalline material in a molten state, and, in drying treatment for removing the liquid present on the pattern-formed surface of the substrate, functions as a substrate treating liquid for assisting the drying treatment.

Here, in the present specification, the "molten state" means that the plastic crystalline material is molten either completely or partially so as to have fluidity and that thus the plastic crystalline material is in a liquid state. The "plastic crystal" means a substance which is formed with a regularly arranged three-dimensional crystal lattice but in which its molecular orientation is in a liquid state, in which the gravity center position of molecules is in a crystalline state and in which furthermore, an orientational and rotational disorder is present. The "plastic crystalline material" means a material which can from a state of the plastic crystal in a process where the state is changed from a liquid state to a solid state or from a solid state to a liquid state. Hence, in the present specification, the "state of the plastic crystal" means one of intermediate phases between a liquid state and a solid state.

In the present embodiment, the plastic crystalline material may have the properties of the sublimable substance. Here, the "sublimable" means that a single substance, a compound or a mixture has the property of changing its phase from a solid phase to a gas phase or from a gas phase to a solid phase without the intervention of a liquid phase, and the "sublimable substance" means a substance which has the sublimable property described above.

The vapor pressure of the plastic crystalline material is preferably 1 KPa to 5 MPa at room temperature, and is more preferably 5 KPa to 1 MPa. In the present specification, the "room temperature" means a temperature range of 5 to 35° C.

The freezing point of the plastic crystalline material is preferably 0 to 100° C. at room temperature, and is more preferably 20 to 50° C. When the freezing point of the plastic crystalline material is equal to or higher than 0° C., the plastic crystalline material can be solidified by cold water, and thus it is possible to reduce the cost of the cooling function. On the other hand, when the freezing point of the plastic crystalline material is equal to or lower than 100° C., the plastic crystalline material can be liquefied by hot water, and thus it is possible to reduce the cost of the temperature raising mechanism.

Although as the plastic crystalline material contained in the substrate treating liquid, the plastic crystalline material in a molten state is contained therein, the substrate treating liquid is consisted of only the plastic crystalline material in a molten state.

The plastic crystalline material is not particularly limited, and for example, cyclohexane and the like can be utilized.

When the plastic crystalline material and a solvent are mixed, the solvent is preferably compatible with the plastic crystalline material. Specifically, as an example of the solvent, at least one sort can be utilized which is selected from a group consisting of pure water, DIW, aliphatic hydrocarbon, aromatic hydrocarbon, ester, alcohol and ether. More specifically, at least one sort can be utilized which is selected from a group consisting of pure water, DIW, methanol, ethanol, IPA, butanol, ethylene glycol, propylene glycol, NMP, DMF, DMA, DMSO, hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL, acetylacetone, 3-pentanone, 2-heptanone, ethyl lactate, cyclohexanone, dibutyl ether, HFE (hydrofluoroether), ethyl nonafluoroisobutyl ether, ethyl nonafluorobutyl ether and m-xylene hexafluoride.

The content of the plastic crystalline material in the substrate treating liquid is not particularly limited, and can be set as necessary.

<1-3 Substrate Treating Method>

Figure 8:
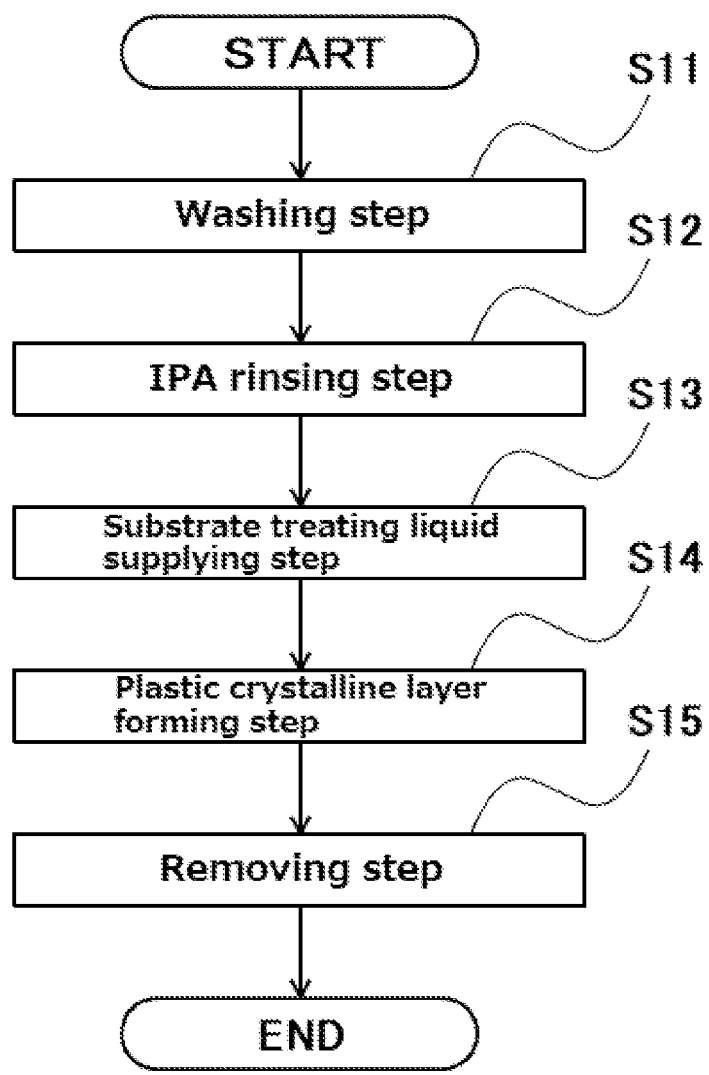
FIG. 8 is a flowchart showing a substrate treating method using the substrate treating apparatus.
Figure 9:
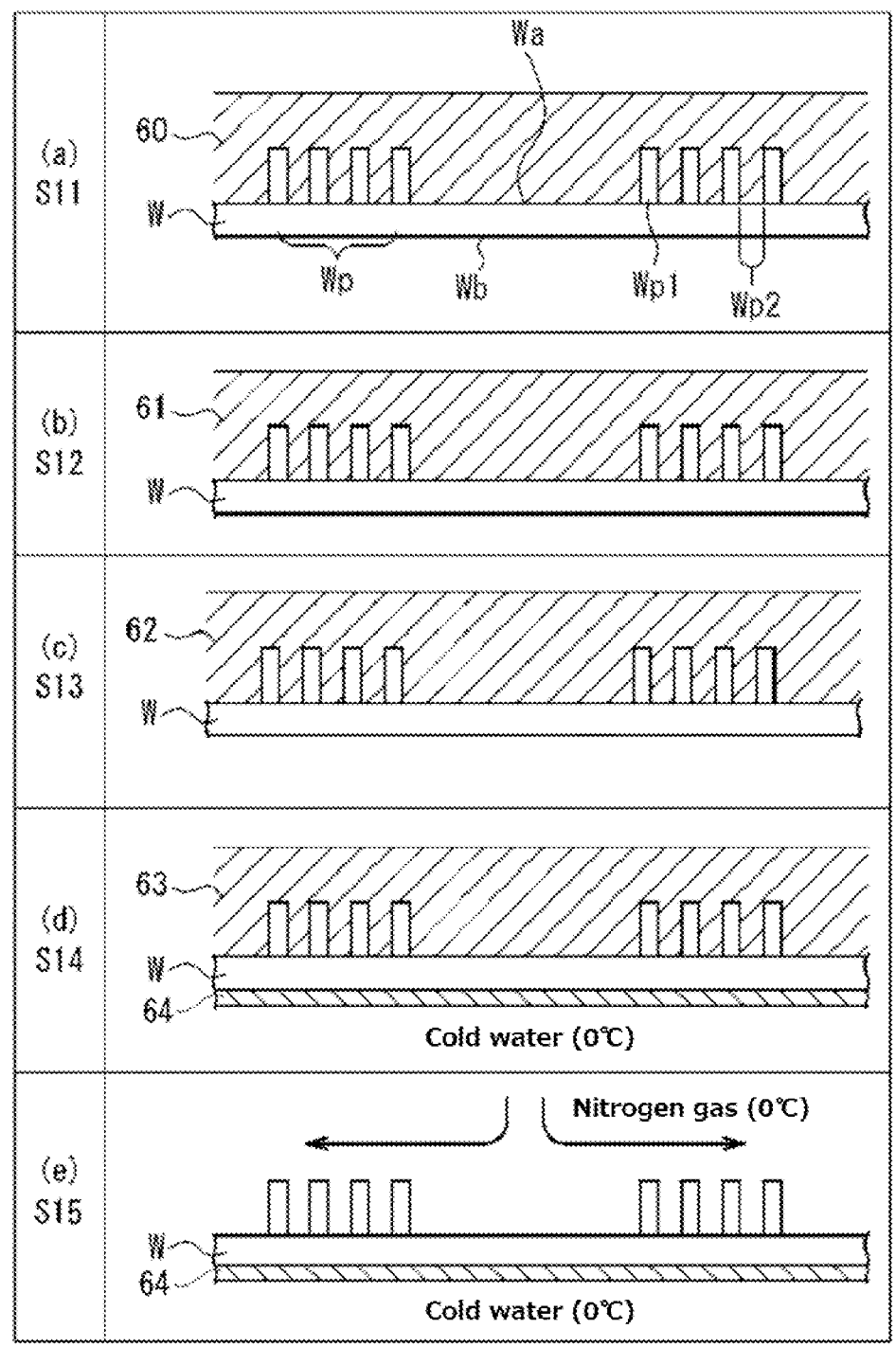
FIG. 9 is a diagram showing the state of the substrate in each step of the substrate treating method.

A substrate treating method using the substrate treating apparatus 1 of the present embodiment will then be described below with reference to FIGS. 8 and 9. FIG. 8 is a flowchart showing the operation of the substrate treating apparatus 1 according to the first embodiment. FIG. 9 is a schematic view showing the state of the substrate W in individual steps of FIG. 8. On the substrate W, a concave/convex pattern Wp is formed in the preceding step. The pattern Wp includes projections Wp1 and recesses Wp2. In the present embodiment, the height of the projection Wp1 falls within a range of 100 to 600 nm, and the width thereof falls within a range of 5 to 50 nm. The shortest distance between two adjacent projections Wp1 (the shortest width of the recesses Wp2) falls within a range of 5 to 150 nm. The aspect ratio of the projection Wp1, that is, a value (height/width) obtained by dividing the height by the width falls within a range of 5 to 35.

The individual steps shown in (a) to (e) shown in FIG. 9 are processed under the atmospheric pressure environment unless otherwise explicitly indicated. Here, the atmospheric pressure environment refers to an environment under a pressure equal to or higher than 0.7 atmospheres and equal to or lower than 1.3 atmospheres with the standard atmospheric pressure (1 atmosphere, 1013 hPa) in the center. In particular, when the substrate treating apparatus 1 is arranged within a clean room under a positive pressure, the environment of the front surface Wa of the substrate W is higher than 1 atmosphere.

An operator first provides an instruction to perform a substrate processing program 19 corresponding to a predetermined substrate W. Thereafter, as a preparation for loading the substrate W into the substrate treating apparatus 1, the operation instruction is provided by the control unit 13 so as to perform the following operation. Specifically, the rotation of the chuck rotation mechanism 56 is stopped, and the chuck pins 54 are located in positions suitable for receiving and delivering the substrate W. The valves 26, 36, 46 and 74 are closed, and the nozzles 22, 32 and 42 are respectively located in the retraction positions P1, P2 and P3. Then, the chuck pins 54 are brought into an opened state by an unillustrated opening/closing mechanism.

When the unprocessed substrate W is loaded into the substrate treating apparatus 1 by an unillustrated substrate loading/unloading mechanism and is placed on the chuck pins 54, the chuck pins 54 are brought into a closed state by the unillustrated opening/closing mechanism.

After the unprocessed substrate W is held by the substrate holder 51, a washing step S11 is performed on the substrate by an unillustrated wet washing unit. The washing step S11 includes rinsing treatment for supplying a washing liquid to the front surface Wa of the substrate W so as to perform washing and then removing the washing liquid. The supply of the washing liquid (in the case of the rinsing treatment, a rinse liquid) is performed, by the operation instruction to the chuck rotation mechanism 56 provided by the control unit 13, on the front surface Wf of the substrate W which is rotated about the rotation shaft A1 at a constant speed. The washing liquid is not particularly limited, and for example, SC-1 (liquid containing ammonia, a hydrogen peroxide solution and water), SC-2 (liquid containing hydrochloric acid, a hydrogen peroxide solution and water) and the like can be utilized. The rinse liquid is not particularly limited, and for example, DIW and the like can be utilized. The amounts of washing liquid and rinse liquid supplied are not particularly limited, and can be set as necessary according to the range which is washed and the like. The washing time is not particularly limited, and can be set as necessary.

In the present embodiment, the wet washing unit is used, thus the SC-1 is supplied to the front surface Wa of the substrate W so as to wash the front surface Wa and thereafter the DIW is further supplied to the front surface Wa so as to remove the SC-1.

(a) shown FIG. 9 shows a state of the substrate W when the washing step S11 is completed. As shown in the figure, on the front surface Wa of the substrate W on which the pattern Wp is formed, the DIW (represented by "60" in the figure) supplied in the washing step S11 is adhered.

An IPA rinsing step S12 of supplying the IPA to the front surface Wa of the substrate W on which the DIW 60 is adhered is performed (see FIG. 8). The control unit 13 first provides the operation instruction to the chuck rotation mechanism 56 such that the substrate W is rotated about the axis A1 at a constant speed.

Then, the control unit 13 provides the operation instruction to the revolvingly driving part 14 such that the nozzle 32 is located in the center portion of the front surface Wa of the substrate W. Then, the control unit 13 provides the operation instruction to the valve 36 such that the valve 36 is opened. In this way, the IPA is supplied from the IPA tank 37 through the pipe 35 and the nozzle 32 to the front surface Wa of the substrate W.

The IPA supplied to the front surface Wa of the substrate W is made to flow from around the center of the front surface Wa of the substrate W toward the peripheral portion of the substrate W by centrifugal force generated by the rotation of the substrate W so as to be diffused over the entire front surface Wa of the substrate W. In this way, the DIW adhered to the front surface Wa of the substrate W is removed by the supply of the IPA, and thus the entire front surface Wa of the substrate W is covered with the IPA. The rotation speed of the substrate W is preferably set such that the thickness of the film formed of the IPA is higher than the height of the projections Wp1 on the entire front surface Wa. The amount of IPA supplied is not particularly limited, and can be set as necessary.

After the completion of the IPA rinsing step S12, the control unit 13 provides the operation instruction to the valve 36 such that the valve 36 is closed. The control unit 13 also provides the operation instruction to the revolvingly driving part 14 such that the nozzle 32 is located in the retraction position P2.

(b) shown in FIG. 9 shows a state of the substrate W when the IPA rinsing step S12 is completed. As shown in the figure, on the front surface Wa of the substrate W on which the pattern Wp is formed, the IPA (represented by "61" in the figure) supplied in the IPA rinsing step S12 is adhered, and the DIW 60 is replaced by the IPA 61 so as to be removed from the front surface Wa of the substrate W.

A substrate treating liquid supplying step (supplying step) S13 of supplying the substrate treating liquid that contains the plastic crystalline material in a molten state to the front surface Wa of the substrate W to which the IPA 61 is adhered (see FIG. 8). Specifically, the control unit 13 provides the operation instruction to the chuck rotation mechanism 56 such that the substrate W is rotated about the axis A1 at a constant speed. Here, the rotation speed of the substrate W is preferably set such that the thickness of the liquid film formed of the substrate treating liquid is higher than the height of the projections Wp1 on the entire front surface Wa.

Then, the control unit 13 provides the operation instruction to the revolvingly driving part 14 such that the nozzle 22 is located in the center portion of the front surface Wa of the substrate W. The control unit 13 then provides the operation instruction to the valve 26 such that the valve 26 is opened. In this way, the substrate treating liquid is supplied from the substrate treating liquid storing tank 271 through the pipe 25 and the nozzle 22 to the front surface Wa of the substrate W. The substrate treating liquid supplied to the front surface Wa of the substrate W is made to flow from around the center of the front surface Wa of the substrate W toward the peripheral portion of the substrate W by centrifugal force generated by the rotation of the substrate W so as to be diffused over the entire front surface Wa of the substrate W. In this way, the IPA adhered to the front surface Wa of the substrate W is removed by the supply of the substrate treating liquid such that the entire front surface Wa of the substrate W is covered with the substrate treating liquid (see (c) shown in FIG. 9).

The temperature of the supplied substrate treating liquid is set within a range equal to or above the melting point of the plastic crystalline material and below the boiling point thereof at least after the substrate treating liquid is supplied to the front surface Wa of the substrate W. For example, when, cyclohexane (having a melting point of 4 to 7° C. and a boiling point of 80.74° C.) described above is used as the plastic crystalline material, the temperature is preferably set within a range equal to or higher than 4° C. and lower than 80.74° C. In this way, it is possible to form, on the front surface Wa of the substrate W, the liquid film made of the substrate treating liquid 62. The amount of substrate treating liquid supplied is not particularly limited, and can be set as necessary.

For example, when the temperature of the substrate W and the temperature of an atmosphere within the chamber 11 are equal to or lower than the melting point of the plastic crystalline material, the temperature of the substrate treating liquid 62 immediately before being supplied in the substrate treating liquid supplying step S13 is preferably adjusted at a temperature sufficiently higher than the melting point in order to prevent the substrate treating liquid 62 from being brought into the state of the plastic crystal or into a solid state on the substrate W after the supply.

When the substrate treating liquid supplying step S13 is completed, the control unit 13 provides the operation instruction to the valve 26 such that the valve 26 is closed. The control unit 13 also provides the operation instruction to the revolvingly driving part 14 such that the nozzle 22 is located in the retraction position P1.

As shown in FIG. 8, a plastic crystalline layer forming step S14 of cooling the substrate treating liquid 62 supplied to the front surface Wa of the substrate W so as to form a plastic crystalline layer is then performed. The control unit 13 first provides the operation instruction to the chuck rotation mechanism 56 such that the substrate W is rotated about the axis A1 at a constant speed. Here, the rotation speed of the substrate W is set such that the substrate treating liquid 62 can form a predetermined film thickness higher than the projections Wp1 on the entire front surface Wa.

Then, the control unit 13 provides the operation instruction to the valve 84 such that the valve 84 is opened. In this way, the coolant (for example, cold water at a predetermined temperature) 64 stored in the coolant tank 821 is discharged through the pipe 83 and the supply pipe 852 from the discharge portion 853 toward the back surface Wb of the substrate W.

The coolant 64 supplied toward the back surface Wb of the substrate W is made to flow from around the center of the back surface Wb of the substrate W toward the direction of the peripheral portion of the substrate W by centrifugal force generated by the rotation of the substrate W so as to be diffused over the entire back surface Wb of the substrate W. In this way, the liquid film of the substrate treating liquid 62 formed on the front surface Wa of the substrate W is cooled to a low temperature which is equal to or higher than the temperature 20° C. lower than the freezing point of the plastic crystalline material and is equal to or lower than the freezing point of the plastic crystalline material and which is preferably equal to or higher than the temperature 5° C. lower than the freezing point of the plastic crystalline material and is equal to or lower than the freezing point of the plastic crystalline material, with the result that a plastic crystalline layer 63 is formed (see (d) shown in FIG. 9).

(d) shown in FIG. 9 shows a state of the substrate W when the plastic crystalline layer forming step S14 is completed. As shown in the figure, the substrate treating liquid 62 supplied in the substrate treating liquid supplying step S13 is cooled by the supply of the coolant 64 to the back surface Wb of the substrate W, and thus the plastic crystalline material is brought into the state of the plastic crystal, with the result that the plastic crystalline layer 63 is formed.

Although the plastic crystalline layer 63 contains at least the plastic crystalline material present in the state of the plastic crystal such that in the plastic crystalline material in the state of the plastic crystal, intermolecular bonds are mutually weakened, the relative position relationship of individual molecules is not changed, and thus they are easily rotated in the positions thereof. Hence, for example, as compared with a solidified body formed of a conventional sublimable substance, the plastic crystalline layer 63 is so soft as to have fluidity. In this way, it is possible to reduce the generation and growth of crystal grain boundaries, and thus it is possible to reduce the act of stress caused by the generation and growth of crystal grain boundaries on a pattern, with the result that it is possible to reduce the occurrence of the collapse of even a pattern which is fine and has a high aspect ratio. As compared with the case of the solidified body, it is possible to reduce the stress exerted on the pattern, and thus it is possible to further reduce the occurrence of the collapse of the pattern. When the plastic crystalline layer 63 is formed in a state where a liquid and the like are present on the substrate W and where the substrate treating liquid 62 is mixed with the liquid, the plastic crystalline layer 63 can contain the liquid and the like.

As shown in FIG. 8, a removing step S15 of bringing the plastic crystalline layer 63 formed on the front surface Wa of the substrate W into a gas state without an intermediate phase of liquid so as to remove the plastic crystalline layer 63 from the front surface Wa of the substrate W is then performed. In the removing step S15, the removal is performed while the supply of cold water (for example, cold water of 0° C. when cyclohexane is used as the plastic crystalline material) to the back surface Wb of the substrate W with the coolant supplying unit 81 is being continued. In this way, it is possible to cool the plastic crystalline layer 63 at a temperature equal to or lower than the freezing point of the plastic crystalline material, and thus it is possible to prevent the plastic crystalline material from being melted from the side of the back surface Wb of the substrate W.

In the removing step S15, the control unit 13 first provides the operation instruction to the chuck rotation mechanism 56 such that the substrate W is rotated about the axis A1 at a constant speed. Here, the rotation speed of the substrate W is set such that nitrogen gas is sufficiently supplied by the rotation of the substrate W to the peripheral portion of the substrate W.

Then, the control unit 13 provides the operation instruction to the revolvingly driving part 14 such that the nozzle 42 is located in the center portion of the front surface Wa of the substrate W. Then, the control unit 13 provides the operation instruction to the valve 46 such that the valve 46 is opened. In this way, the gas (for example, nitrogen gas of 0° C. when cyclohexane is used as the plastic crystalline material) is supplied from the gas tank 471 through the pipe 45 and the nozzle 42 toward the front surface Wa of the substrate W.

Here, the partial pressure of the vapor of the plastic crystalline material in the nitrogen gas is set lower than the saturated vapor pressure of the plastic crystalline material at a temperature when the nitrogen gas is supplied. Hence, the nitrogen gas described above is supplied to the front surface Wa of the substrate W so as to make contact with the plastic crystalline layer 63, and thus the plastic crystalline material in the state of the plastic crystal contained in the plastic crystalline layer 63 is brought into a gas state. Since the nitrogen gas has a temperature lower than the melting point of the plastic crystalline material, it is possible to bring the plastic crystalline material into a gas state while preventing the plastic crystalline material in the state of the plastic crystal from being brought into a liquid state.

The plastic crystalline material in the state of the plastic crystal is changed into a gas state without an intermediate phase of liquid, and thus when the substance such as the IPA present on the front surface Wa of the substrate W is removed, it is possible to satisfactorily dry the front surface Wa of the substrate W while preventing surface tension from acting on the pattern Wp so as to reduce the occurrence of the collapse of the pattern.

(e) shown in FIG. 9 shows a state of the substrate W when the removing step S15 is completed. As shown in the figure, the plastic crystalline layer 63 in which the plastic crystalline material formed in the plastic crystalline layer forming step S14 is present in the state of the plastic crystal is brought into a gas state by the supply of the nitrogen gas at a predetermined temperature so as to be removed from the front surface Wa, with the result that the drying of the front surface Wa of the substrate W is completed.

After the completion of the removing step S15, the control unit 13 provides the operation instruction to the valve 46 such that the valve 46 is closed. The control unit 13 also provides the operation instruction to the revolvingly driving part 14 such that the nozzle 42 is located in the retraction position P3.

In this way, a series of substrate drying treatment steps are completed. After the substrate drying treatment as described above, the substrate W on which the drying treatment has been performed is unloaded from the chamber 11 by the unillustrated substrate loading/unloading mechanism.

As described above, in the present embodiment, the substrate treating liquid containing the plastic crystalline material in a molten state is supplied to the front surface Wa of the substrate W to which the IPA is adhered, and thus the plastic crystalline layer in which the plastic crystalline material is present in the state of the plastic crystal is formed on the front surface Wa of the substrate W. Thereafter, the plastic crystalline material present in the state of the plastic crystal is changed into a gas state without the intermediate phase of liquid, and thus the plastic crystalline layer is removed from the front surface Wa of the substrate W, with the result that the drying treatment on the substrate W is performed. In this way, in the present embodiment, as compared with a conventional substrate drying treatment technology, it is possible to reliably reduce the collapse of even a pattern which is fine and has a high aspect.

Second Embodiment

A second embodiment according to the present invention will be described below.

The present embodiment differs from the first embodiment in that in the plastic crystalline layer forming step S14, instead of the supply of the coolant with the coolant supplying unit 81, the supply of nitrogen gas with the gas supplying unit 41 is performed and that in the removing step S15, the supply of the coolant to the back surface Wb of the substrate W is not performed and only the supply of the nitrogen gas is performed. In the configuration described above, it is also possible to satisfactorily dry the front surface Wa of the substrate W while reducing the collapse of the pattern.

<2-1 Configuration of Substrate Treating Apparatus and Process Liquid>

A substrate treating apparatus and a control unit according to the second embodiment basically have the same configurations as the substrate treating apparatus 1 and the control unit 13 according to the first embodiment (see FIGS. 1 to 7). Hence, they are identified with the same symbols, and the description thereof will be omitted. The substrate treating liquid used in the present embodiment is also the same as that according to the first embodiment, and thus the description thereof will be omitted.

<2-2 Substrate Treating Method>

A substrate treating method according to the second embodiment using the substrate treating apparatus 1 having the same configuration as in the first embodiment will then be described.

Figure 10:
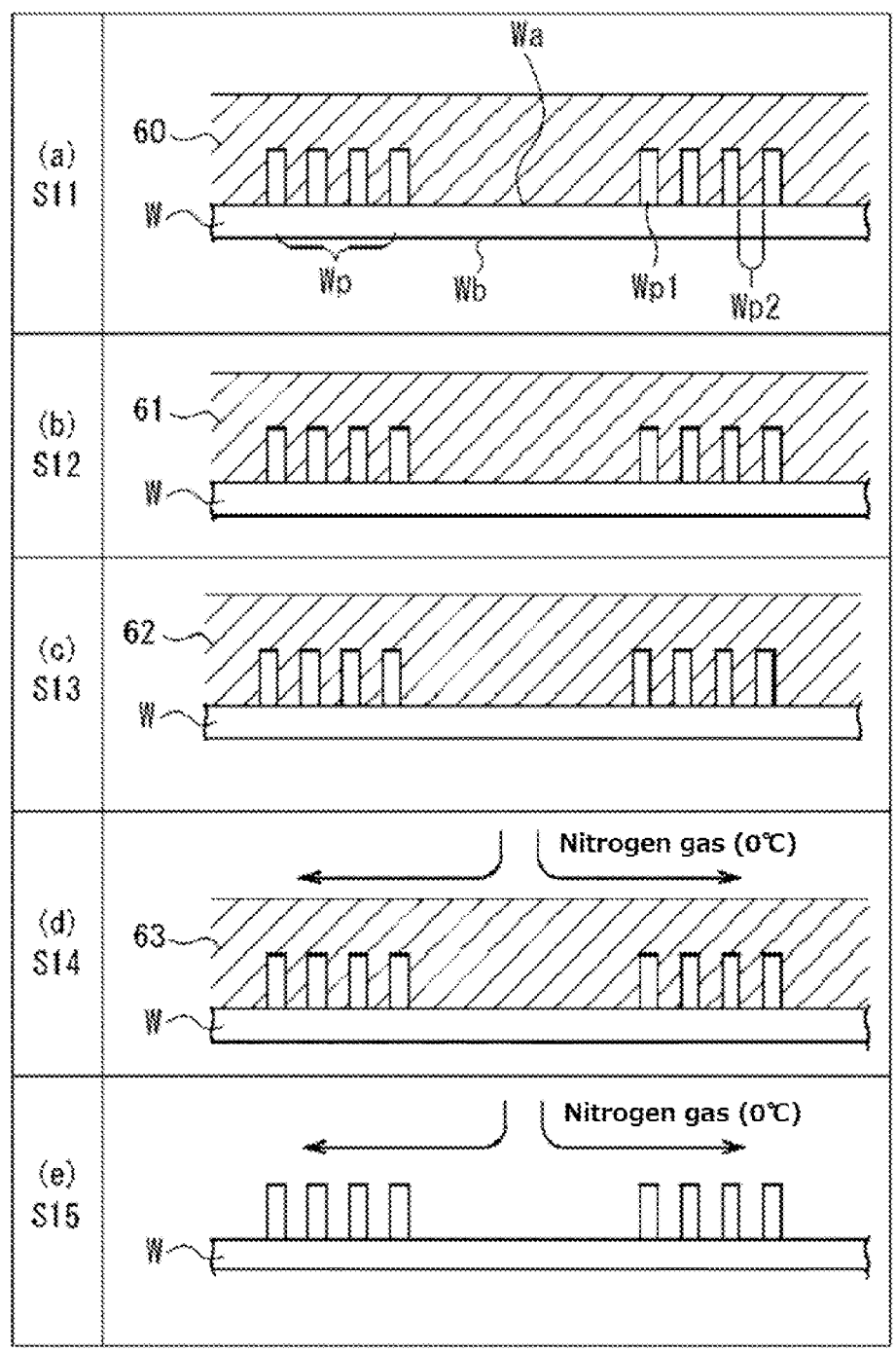
FIG. 10 is a diagram showing the state of the substrate in each step of a substrate treating method according to a second embodiment of the present invention.

The steps of the substrate treating will be described below with reference to FIGS. 1 to 8 and FIG. 10 as necessary. FIG. 10 is a schematic view showing the state of the substrate W in the individual steps of FIG. 8 in the second embodiment. In the second embodiment, the washing step S11, the IPA rinsing step S12 and the substrate treating liquid supplying step S13 shown in (a) to (c) shown in FIG. 10 are the same as in the first embodiment, and thus the description thereof will be omitted.

With reference to FIG. 8, after the washing step S11, the IPA rinsing step S12, the substrate treating liquid supplying step S13 are performed, the plastic crystalline layer forming step S14 is performed in which the film of the substrate treating liquid 62 supplied to the front surface Wa of the substrate W is cooled, and in which thus the plastic crystalline material is changed into the state of the plastic crystal so as to form the plastic crystalline layer. Specifically, the control unit 13 provides the operation instruction to the chuck rotation mechanism 56 such that the substrate W is rotated about the axis A1 at a constant speed. Here, the rotation speed of the substrate W is preferably set such that the thickness of the liquid film formed of the substrate treating liquid is higher than the height of the projections Wp1 on the entire front surface Wa.

Then, the control unit 13 provides the operation instruction to the revolvingly driving part 14 such that the nozzle 42 is located in the center portion of the front surface Wa of the substrate W. Then, the control unit 13 provides the operation instruction to the valve 46 such that the valve 46 is opened. In this way, the gas (in the present embodiment, nitrogen gas of 0° C.) is supplied from the gas storing part 47 through the pipe 45 and the nozzle 42 toward the front surface Wa of the substrate W.

The nitrogen gas supplied toward the front surface Wa of the substrate W is made to flow from around the center of the front surface Wa of the substrate W toward the direction of the peripheral portion of the substrate W by centrifugal force generated by the rotation of the substrate W so as to be diffused over the entire front surface Wa of the substrate W covered with the liquid film of the substrate treating liquid 62. In this way, the liquid film of the substrate treating liquid 62 formed on the front surface Wa of the substrate W is cooled to a temperature which is equal to or higher than the temperature 20° C. lower than the freezing point of the plastic crystalline material and is equal to or lower than the freezing point and which is preferably equal to or higher than the temperature 5° C. lower than the freezing point of the plastic crystalline material and is equal to or lower than the freezing point of the plastic crystalline material. In this way, for the same reason as described in the first embodiment, the plastic crystalline layer 63 is formed on the front surface Wa of the substrate W.

Although in the second embodiment, the nitrogen gas is used so as to cool the substrate treating liquid, as long as the gas is inert to the plastic crystalline material, there is no limitation to the nitrogen gas. Specific examples of the gas inert to the plastic crystalline material include helium gas, neon gas, argon gas and air (a mixture gas of 80% of nitrogen and 20% of oxygen in volume). Alternatively, a mixture gas obtained by mixing a plurality of types of gases described above may be used.

The removing step S15 of changing the plastic crystalline layer 63 formed on the front surface Wa of the substrate W into a gas state without the an intermediate phase of liquid so as to remove the plastic crystalline layer 63 from the front surface Wa of the substrate W is then performed. Even in the removing step S15, the supply of the nitrogen gas from the nozzle 42 is continued from the plastic crystalline layer forming step S14.

Here, the partial pressure of the vapor of the plastic crystalline material in the nitrogen gas is set lower than the saturated vapor pressure of the plastic crystalline material at a temperature when the nitrogen gas is supplied. Hence, the nitrogen gas described above makes contact with the plastic crystalline layer 63, and thus the plastic crystalline material in the state of the plastic crystal contained in the plastic crystalline layer 63 is brought into a gas state. Since the nitrogen gas has a temperature lower than the melting point of the plastic crystalline material, it is possible to bring the plastic crystalline material into a gas state while preventing the plastic crystalline material in the state of the plastic crystal from being brought into a liquid state.

The plastic crystalline material in the state of the plastic crystal is changed into a gas state without the an intermediate phase of liquid, and thus when the substance such as the IPA present on the front surface Wa of the substrate W is removed, it is possible to satisfactorily dry the front surface Wa of the substrate W while preventing surface tension from acting on the pattern Wp so as to reduce the occurrence of the collapse of the pattern.

(e) shown in FIG. 10 shows a state of the substrate W when the removing step S15 is completed. As shown in the figure, the plastic crystalline layer 63 in which the plastic crystalline material formed in the plastic crystalline layer forming step S14 is present in the state of the plastic crystal is brought into a gas state by the supply of the nitrogen gas at a predetermined temperature so as to be removed from the front surface Wa, with the result that the drying of the front surface Wa of the substrate W is completed.

After the completion of the removing step S15, the control unit 13 provides the operation instruction to the valve 46 such that the valve 46 is closed. The control unit 13 also provides the operation instruction to the revolvingly driving part 14 such that the nozzle 42 is located in the retraction position P3.

In this way, a series of substrate drying treatment steps are completed. After the substrate drying treatment as described above, the substrate W on which the drying treatment has been performed is unloaded from the chamber 11 by the unillustrated substrate loading/unloading mechanism.

In the second embodiment, in the plastic crystalline layer forming step S14 and the removing step S15, the common gas supplying unit 41 is used so as to supply the nitrogen gas inert to the plastic crystalline material at the temperature which is equal to or higher than the temperature 20° C. lower than the freezing point of the plastic crystalline material and is equal to or lower than the freezing point. In this way, immediately after the plastic crystalline layer forming step S14, the removing step S15 can be started, the processing time necessary for operating the individual portions of the substrate treating apparatus 1 and the amount of memory in the substrate processing program 19 of the control unit 13 to be operated can be reduced and the number of components used in the processing can be reduced, with the result that it is possible to reduce the cost of the apparatus. In particular, in the present embodiment, the pressure reducing unit 71 is not used, and thus the pressure reducing unit 71 can be omitted.

Third Embodiment

A third embodiment according to the present invention will be described below. The present embodiment differs from the second embodiment in that in the plastic crystalline layer forming step S14 and the removing step S15, instead of the supply of the nitrogen gas, the interior of the chamber is reduced in pressure. Even in the configuration described above, it is possible to satisfactorily dry the surface of the substrate W while reducing the collapse of the pattern.

<3-1 Overall Configuration of Substrate Treating Apparatus and Substrate Treating Liquid>

A substrate treating apparatus and a control unit according to the third embodiment basically have the same configurations as the substrate treating apparatus 1 and the control unit 13 according to the first embodiment (see FIGS. 1 and 2), and thus they are identified with the same symbols, and the description thereof will be omitted. The substrate treating liquid used in the present embodiment is also the same as that according to the first embodiment, and thus the description thereof will be omitted.

<3-2 Substrate Treating Method>

Next, a substrate treating method according to the third embodiment using the substrate treating apparatus 1 having the same configuration as in the first embodiment will be described.

Figure 11:
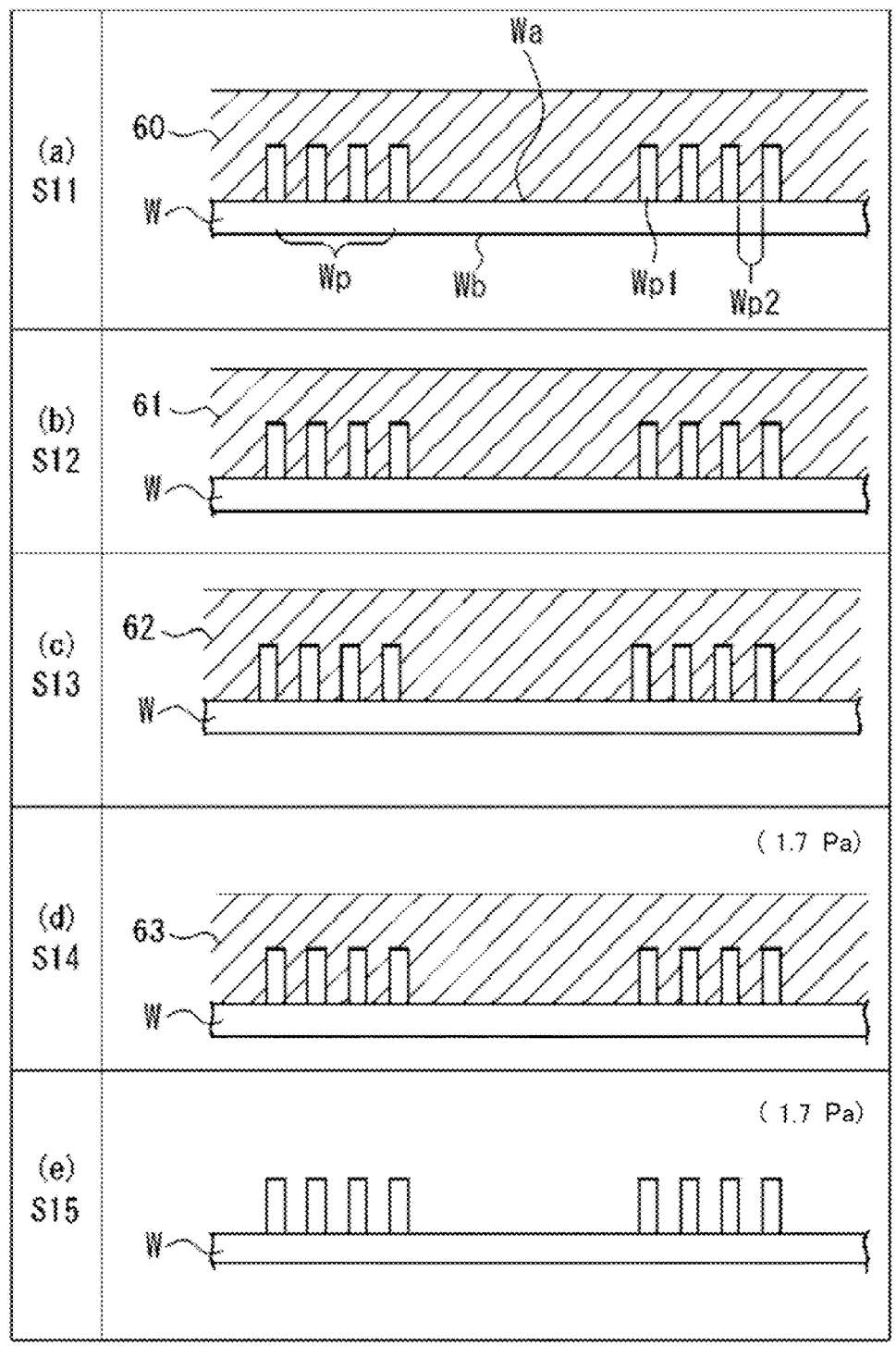
FIG. 11 is a diagram showing the state of the substrate in each step of a substrate treating method according to a third embodiment of the present invention.

The steps of substrate processing will be described below with reference to FIGS. 1 to 8 and FIG. 11 as necessary. FIG. 11 is a schematic view showing the state of the substrate W in each step of FIG. 8 in the third embodiment. In the third embodiment, the washing step S11, the IPA rinsing step S12 and the substrate treating liquid supplying step S13 shown in FIG. 8 and (a) to (c) shown in FIG. 11 are the same as in the first embodiment, and thus the description thereof will be omitted.

Here, (a) shown in FIG. 11 shows a state of the substrate W in which the front surface Wa is covered by the liquid film of the DIW 60 when the washing step S11 in the third embodiment is completed, (b) shown in FIG. 11 shows a state of the substrate W in which the front surface Wa is covered by the liquid film of the IPA 61 when the IPA rinsing step S12 in the third embodiment is completed and (c) shown in FIG. 11 shows a state of the substrate W in which the front surface Wa is covered by the liquid film of the substrate treating liquid 62 melting the plastic crystalline material when the substrate treating liquid supplying step S13 in the third embodiment is completed.

The individual processing steps shown in (a) to (c) shown in FIG. 11 are processed under an atmospheric pressure environment unless otherwise indicated. Here, the atmospheric pressure environment refers to an environment under a pressure equal to or higher than 0.7 atmospheres but equal to or lower than 1.3 atmospheres with the standard atmospheric pressure (1 atmosphere, 1013 hPa) in the center. In particular, when the substrate treating apparatus 1 is arranged within a clean room under a positive pressure, the environment of the front surface Wa of the substrate W is higher than 1 atmosphere. The processing steps (details of which will be described later) shown in (d) and (e) shown in FIG. 11 are performed under a reduced pressure environment of 1.7 Pa ($1.7\times10^{-5}$ atmospheres).

With reference back to FIG. 8, after the washing step S11, the IPA rinsing step S12 and the substrate treating liquid supplying step S13 are performed, the plastic crystalline layer forming step S14 is performed in which the liquid film of the substrate treating liquid 62 supplied to the front surface Wa of the substrate W is cooled and thus the plastic crystalline material is changed into the state of the plastic crystal so as to form the plastic crystalline layer. Specifically, the control unit 13 first provides the operation instruction to the chuck rotation mechanism 56 such that the substrate W is rotated about the axis A1 at a constant speed. Here, the rotation speed of the substrate W is preferably set such that the thickness of the liquid film formed of the substrate treating liquid is higher than the height of the projections Wp1 on the entire front surface Wa.

Then, the control unit 13 provides the operation instruction to the exhaust pump 72 such that the drive of the exhaust pump 72 is started. The control unit 13 then provides the operation instruction to the valve 74 such that the valve 74 is opened. In this way, the gas within the chamber 11 is exhausted through the pipe 73 to the outside of the chamber 11. The interior of the chamber 11 is brought into a sealed state except the pipe 73, and thus the internal environment of the chamber 11 is reduced in pressure from atmospheric pressure.

The pressure reduction is performed from atmospheric pressure (about 1 atmosphere, about 1013 hPa) to about 0.01 atmospheres (about 10.13 hPa). There is no limitation to the gas pressure described above in the practice of the invention of the present application, and the gas pressure within the chamber 11 after the pressure reduction may be set as necessary according to the pressure resistance and the like of the chamber 11 and the like. The interior of the chamber 11 is reduced in pressure, and thus the substrate treating liquid 62 supplied to the front surface Wa of the substrate W is evaporated, with the result that the substrate treating liquid 62 is cooled by the heat of the vaporization such that the plastic crystalline material is brought into the state of the plastic crystal.

(d) shown in FIG. 11 shows a state of the substrate W when the plastic crystalline layer forming step S14 is completed. As shown in the figure, the substrate treating liquid 62 supplied in the substrate treating liquid supplying step S13 is cooled by the evaporation of the substrate treating liquid 62 caused by the pressure reduction within the chamber 11, and thus the plastic crystalline material is brought into the state of the plastic crystal, with the result that the plastic crystalline layer 63 is formed.

Here, the layer thickness of the plastic crystalline layer 63 is reduced only by the amount of substrate treating liquid 62 that has evaporated. Hence, in the substrate treating liquid supplying step S13 in the present embodiment, with consideration given to the amount of substrate treating liquid 62 evaporated in the plastic crystalline layer forming step S14, the rotation speed of the substrate W and the like are preferably adjusted such that the substrate treating liquid 62 becomes a liquid film with a predetermined thickness or more.

With reference back to FIG. 8, the removing step S15 of changing the plastic crystalline layer 63 formed on the front surface Wa of the substrate W into a gas state without the intermediate phase of liquid so as to remove the plastic crystalline layer 63 from the front surface Wa of the substrate W is then performed. Even in the removing step S15, the pressure reduction processing within the chamber 11 by the pressure reducing unit 71 is continued from the plastic crystalline layer forming step S14.

By the pressure reduction processing, the pressure of the environment within the chamber 11 is lower than the saturated vapor pressure of the plastic crystalline material. Hence, the pressure reduction environment as described above is maintained, and thus the plastic crystalline material in the state of the plastic crystal in the plastic crystalline layer 63 is brought into a gas state.

When the plastic crystalline material in the state of the plastic crystal in the plastic crystalline layer 63 is brought into a gas state, the plastic crystalline layer 63 is deprived of heat, and thus the plastic crystalline layer 63 is cooled. Hence, in the third embodiment, in the removing step S15, even when the temperature of the environment within the chamber 11 is slightly higher (normal temperature environment) than the melting point of the plastic crystalline material, the plastic crystalline layer 63 can be maintained at a temperature lower than the melting point of the plastic crystalline material without being additionally cooled, with the result that it is possible to remove the plastic crystalline layer 63 while preventing the plastic crystalline material in the plastic crystalline layer 63 from being brought into a liquid state. Consequently, it is not necessary to additionally provide a cooling mechanism, and thus it is possible to reduce the costs of the apparatus and the processing.

As described above, the plastic crystalline material in the state of the plastic crystal is changed into a gas state without the intermediate phase of liquid, and thus when the substance such as the IPA present on the front surface Wa of the substrate W is removed, it is possible to satisfactorily dry the front surface Wa of the substrate W while the surface tension is prevented from acting on the pattern Wp so as to reduce the occurrence of the collapse of the pattern.

(e) shown in FIG. 11 shows a state of the substrate W when the removing step S15 is completed. As shown in the figure, the plastic crystalline layer 63 of the plastic crystalline material formed in the plastic crystalline layer forming step S14 is brought into a gas state by the formation of the pressure reduction environment with the chamber 11 so as to be removed from the front surface Wa, with the result that the drying of the front surface Wa of the substrate W is completed.

After the completion of the removing step S15, the control unit 13 provides the operation instruction to the valve 74 such that the valve 74 is opened. The control unit 13 also provides the operation instruction to the exhaust pump 72 such that the operation of the exhaust pump 72 is stopped. Then, the control unit 13 provides the operation instruction to the valve 46 such that the valve 46 is opened, and thus the gas (nitrogen gas) is introduced into the chamber 11 from the gas tank 47 through the pipe 45 and the nozzle 42, with the result that the interior of the chamber 11 is returned from the pressure reduction environment to the atmospheric pressure environment. Here, the nozzle 42 may be located in the retraction position P3 or may be located in the center portion of the front surface Wa of the substrate W.

The method of returning the interior of the chamber 11 to the atmospheric pressure environment after the completion of the removing step S15 is not limited to the method described above, and various types of known methods may be adopted.

In this way, a series of substrate drying treatment steps are completed. After the substrate drying treatment as described above, the substrate W on which the drying treatment has been performed is unloaded from the chamber 11 by the unillustrated substrate loading/unloading mechanism.

As described above, in the present embodiment, the substrate treating liquid melting the plastic crystalline material is supplied to the front surface Wa of the substrate W to which the IPA is adhered so as to replace the IPA. Thereafter, the plastic crystalline material is brought into the state of the plastic crystal, thus the plastic crystalline layer is formed on the front surface Wa of the substrate W and then the plastic crystalline material in the state of the plastic crystal is changed into a gas state without the intermediate phase of liquid so as to be removed from the front surface Wa of the substrate W. In this way, the drying treatment on the substrate W is performed.

As in the present embodiment, even when the plastic crystalline layer of the gas process liquid is formed by pressure reduction so as to remove the plastic crystal, it is possible to satisfactorily dry the substrate W while preventing the collapse of the pattern. Specific pattern reduction effects will be described later in examples.

In the present embodiment, in the plastic crystalline layer forming step S14 and the removing step S15, the common pressure reducing unit 71 is used, and thus the interior of the chamber 11 is reduced in pressure. In this way, immediately after the plastic crystalline layer forming step S14, the removing step S15 can be started, and thus the processing time necessary for operating the individual portions of the substrate treating apparatus 1, the amount of memory in the substrate processing program 19 of the control unit 13 to be operated can be reduced and the number of components used in the processing can be reduced, with the result that it is possible to reduce the cost of the apparatus. In particular, in the third embodiment, low-temperature nitrogen gas is not used, and thus the temperature adjusting part 272 in the gas supplying unit 41 can be omitted. When the interior of the chamber 11 is returned from the pressure reduction environment to the atmospheric pressure environment, and a unit other than the gas supplying unit 41 is used, the gas supplying unit 41 may be omitted. The pressure reduction may be any one of the plastic crystalline layer forming step S14 and the removing step S15.

(Variations)

In the above discussion, the preferred embodiments of the present invention are described. However, the present invention is not limited to these embodiments, and can be practiced in other various forms. The major ones of the other various forms will be illustrated below.

In the first to third embodiments, within the one chamber 11, the individual steps are performed on the substrate W. However, there is no limitation to this configuration in the practice of the present invention, and a chamber may be prepared for each of the steps.

For example, in each of the embodiments, the following configuration may be adopted in which the steps up to the plastic crystalline layer forming step S14 are performed in a first chamber, in which after the plastic crystalline material is formed on the front surface Wa of the substrate W, the substrate W is unloaded from the first chamber, in which the substrate W where the plastic crystalline material is formed is loaded into a separate second chamber and in which the removing step S15 is performed in the second chamber.

Preferred examples of this invention will be illustratively described in detail below. However, unless otherwise restrictively described, materials, mixed amounts and the like described in the examples are not intended to limit the scope of this invention.

(Substrate)

Figure 12:
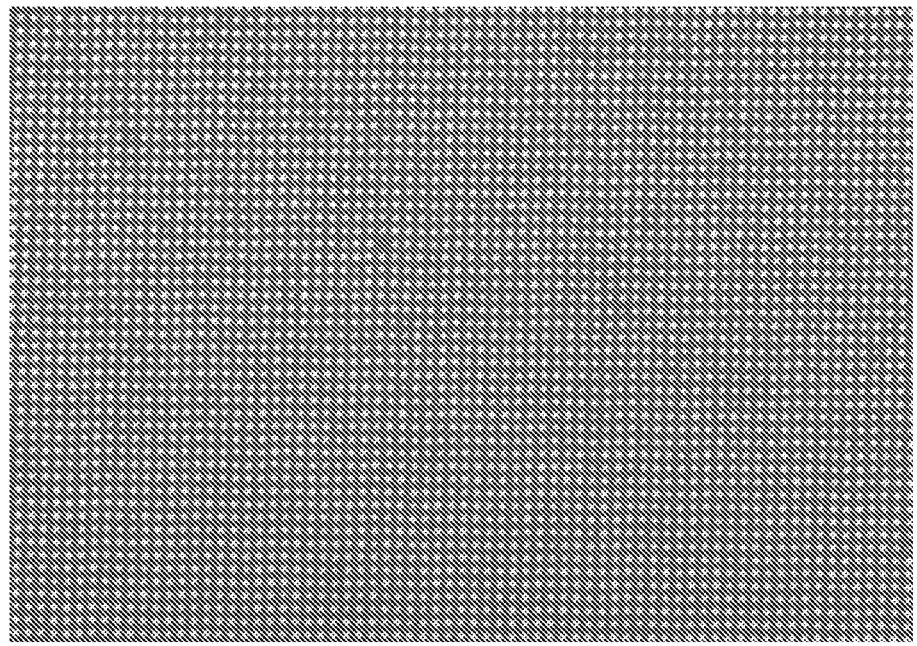
FIG. 12 is an SEM image showing a pattern-formed surface of an unprocessed silicon substrate used in examples and comparative examples of the present invention.

As a substrate, a silicon substrate in which a model pattern was formed on its front surface was prepared. FIG. 12 shows an SEM (Scanning Electron Microscope) image showing the surface of the silicon substrate on which the model pattern is formed (magnification: 20,000 times). As the model pattern, a pattern was adopted in which cylinders (whose aspect ratio is 20) having a diameter of 28 nm and a height of 560 nm were aligned at intervals of about 80 nm. In FIG. 12, portions shown in white are the head portions of the cylinder portions (that is, the projections of the pattern), and the portions shown in black are the recesses of the pattern. As shown in FIG. 12, it was confirmed that on the pattern-formed surface, white circles which were substantially equal in size to each other were aligned regularly.

Example 1

In the present example, by procedures described below, drying treatment was performed on the silicon substrate, and the effect of reducing the collapse of the pattern was evaluated. In the processing of the silicon substrate, the substrate treating apparatus described in the first embodiment was used.

<Procedure 1-1 Radiation of Ultraviolet Rays>

Initially, ultraviolet rays were radiated onto the front surface of the silicon substrate to make the front surface property thereof hydrophilic. In this way, liquid was made to easily enter the recesses of the pattern, and thus after the supply of the liquid, an environment in which the collapse of a pattern easily occurred was artificially formed.

<Procedure 1-2 Substrate Treating Liquid Supplying Step>

Then, within the chamber 11 under atmospheric pressure, a substrate treating liquid (whose temperature was 25° C.) consisting of melting a plastic crystalline material was directly supplied to the dried pattern-formed surface of the silicon substrate. In this way, on the pattern-formed surface of the silicon substrate, a liquid film made of the substrate treating liquid was formed. As the plastic crystalline material, cyclohexane (product name: cyclohexane made by Wako Pure Chemical, Ltd.) was used. In the compound described above, its surface tension was 25.3 mN/m under an environment of 20° C., and its vapor pressure was 22.5 kPa (168.8 mmHg) under an environment of 37.7° C. The compound was a substance whose melting point and freezing point were 4 to 7° C., whose boiling point was 80.74° C. and whose specific gravity was 0.779 g/ml under an environment of 25° C.

<Procedure 1-3 Plastic Crystalline Layer Forming Step>

Then, under the atmospheric pressure environment, cold water of 0° C. was supplied to the back surface of the silicon substrate on which the liquid film formed of the substrate treating liquid was formed so as to cool the substrate treating liquid through the silicon substrate, and thus a plastic crystalline layer was formed.

<Procedure 1-4 Removing Step>

Then, the interior of the chamber 11 in which the silicon substrate was stored was reduced in pressure with the pressure reducing unit 71, and the plastic crystalline material in the state of the plastic crystal was changed into a gas state while preventing the plastic crystalline layer from being brought into a liquid state, with the result that the plastic crystalline layer was removed from the pattern-formed surface of the silicon substrate.

Figure 13:
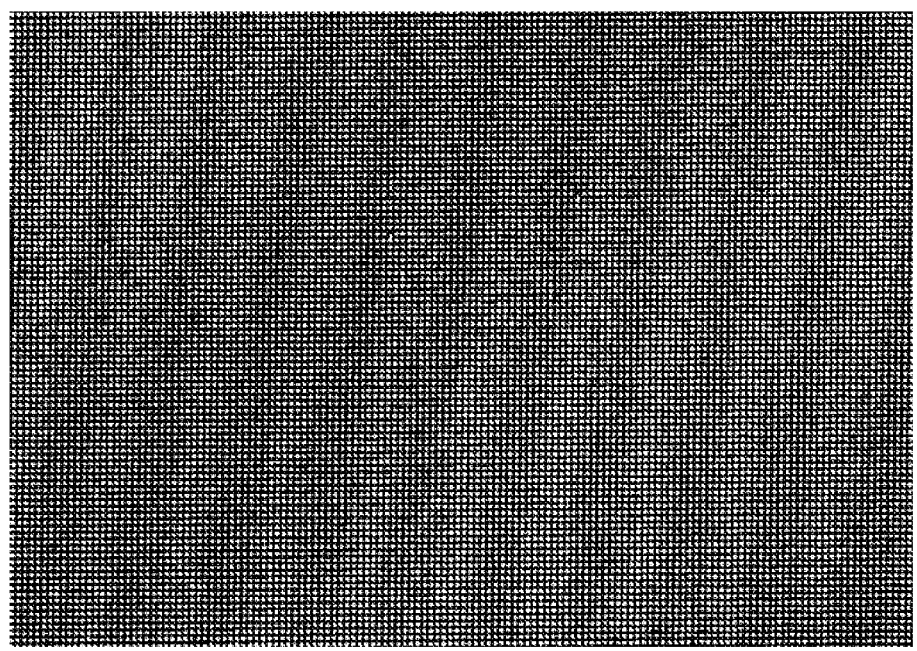
FIG. 13 is an SEM image showing a pattern-formed surface of a silicon substrate on which substrate processing in example 1 of the present invention was performed.

FIG. 13 is an SEM image of the silicon substrate after the procedures 1-1 to 1-4 described above were performed (magnification: 10,000 times). As compared with the pattern-formed surface (see FIG. 12) of the silicon substrate before the drying treatment, the collapse of the pattern was hardly found, and the collapse rate in the displayed region was 0.1%. In this way, it is found that when cyclohexane is used as the plastic crystalline material, it is possible to extremely satisfactorily reduce the collapse of the pattern, and that thus the plastic crystalline material is effective for the drying of the substrate.

The collapse rate of the pattern was a value which was calculated by the formula below.

$$\text{collapse rate (\%)} = (\text{the number of projections collapsed in an arbitrary region})/(\text{the total number of projections in the region}) \times 100$$

Comparative Example 1

Figure 14:
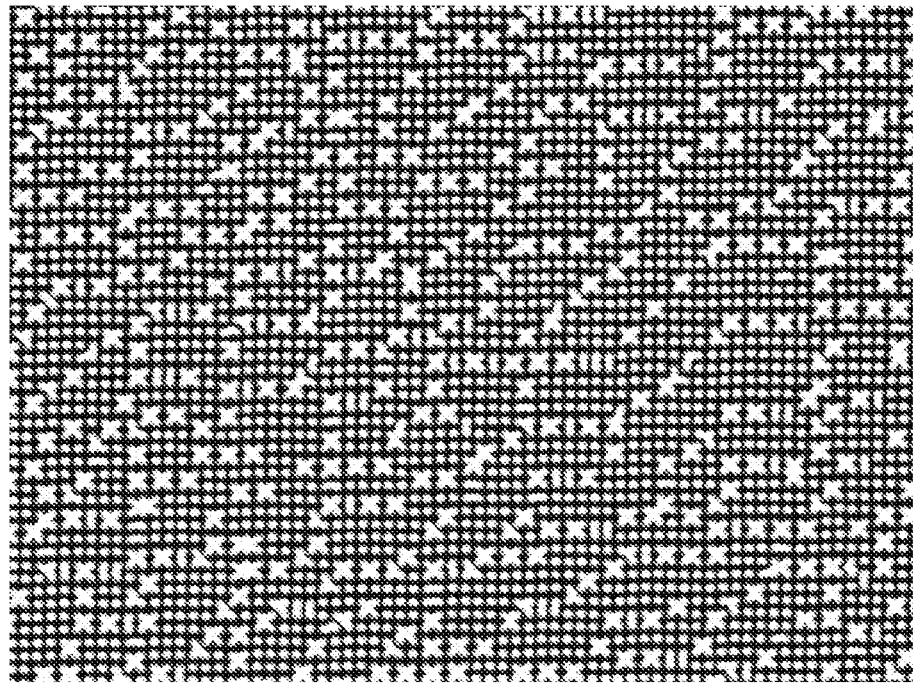
FIG. 14 is an SEM image showing a pattern-formed surface of a silicon substrate on which substrate processing in comparative example 1 was performed.

In the present comparative example, as the substrate treating liquid, instead of cyclohexane serving as the plastic crystalline material, t-butanol serving as a sublimable substance was used. Except for that, as in example 1, the drying treatment on the silicon substrate was performed FIG. 14 is an SEM image of a region where the average collapse rate of the pattern was indicated in the silicon substrate after the procedures described above were performed (magnification: 20,000 times). It was confirmed that as compared with the pattern-formed surface (see FIG. 11) of the silicon substrate before the drying treatment, parts of a white spotted pattern were observed in a large number of places, and that the collapse of the pattern caused by the generation and growth of crystal grain boundaries occurred. The collapse rate was about 52.3%.

Comparative Example 2

In the present comparative example, as the substrate treating liquid, instead of cyclohexane serving as the plastic crystalline material, acetic acid serving as a sublimable substance was used. Except for that, as in example 1, the drying treatment on the silicon substrate was performed.

Figure 15:
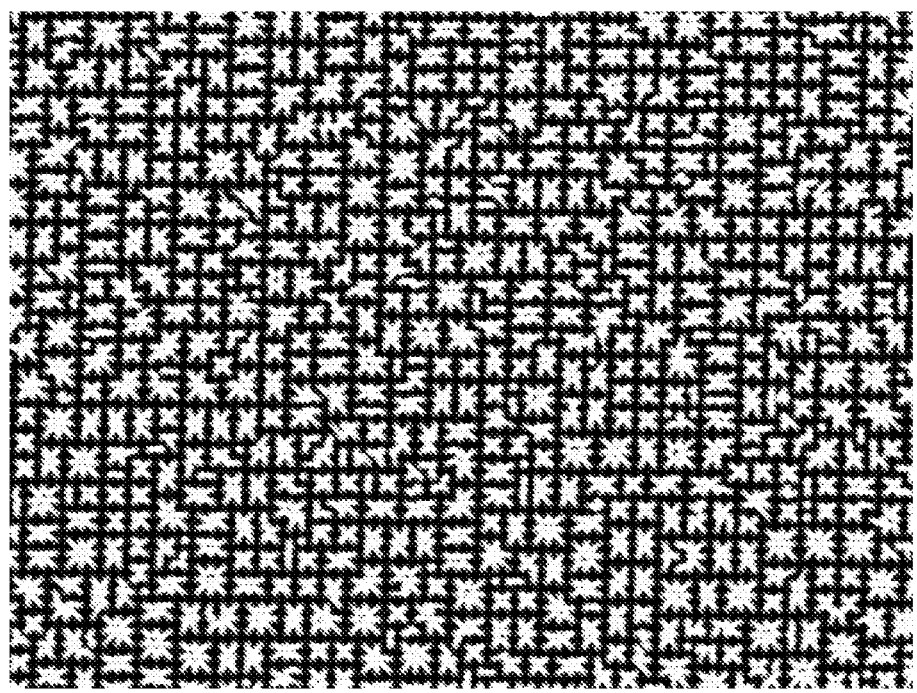
FIG. 15 is an SEM image showing a pattern-formed surface of a silicon substrate on which substrate processing in comparative example 2 was performed.

FIG. 15 is an SEM image of a region where the average collapse rate of the pattern was indicated in the silicon substrate after the procedures described above were performed (magnification: 20,000 times). It was confirmed that as compared with the pattern-formed surface (see FIG. 12) of the silicon substrate before the drying treatment, parts where white circles were enlarged were observed in a large number of places, and that the collapse of the pattern was not reduced. The collapse rate was about 99.1%.

Comparative Example 3

In the present comparative example, as the substrate treating liquid, instead of cyclohexane serving as the plastic crystalline material, p-xylene serving as a sublimable substance was used. Except for that, as in example 1, the drying treatment on the silicon substrate was performed.

Figure 16:
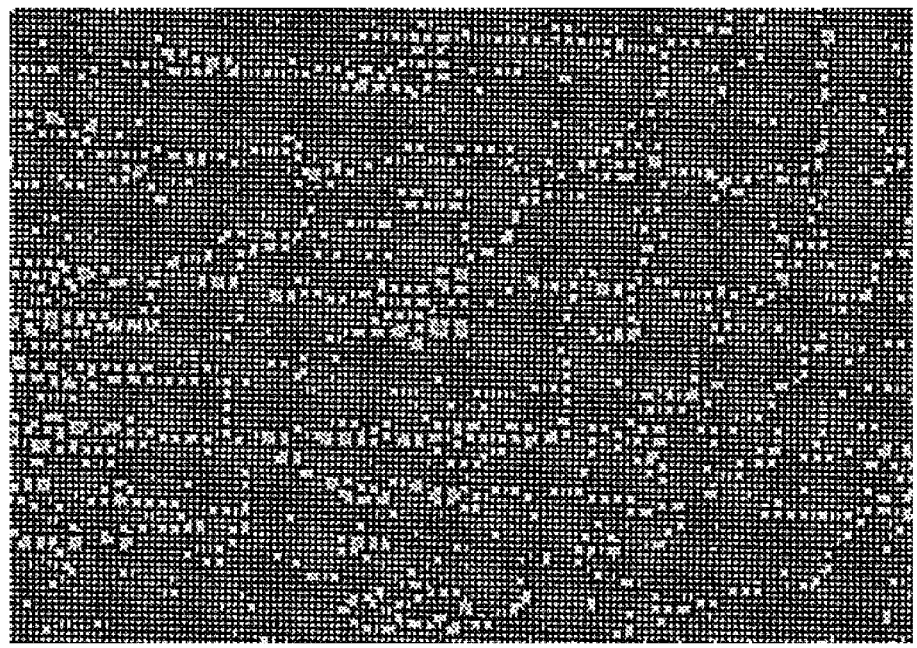
FIG. 16 is an SEM image showing a pattern-formed surface of a silicon substrate on which substrate processing in comparative example 3 was performed.

FIG. 16 is an SEM image of a region where the average collapse rate of the pattern was indicated in the silicon substrate after the procedures described above were performed (magnification: 10,000 times). It was confirmed that as compared with the pattern-formed surface (see FIG. 12) of the silicon substrate before the drying treatment, parts of a white spotted pattern were observed, and that the collapse of the pattern caused by the generation and growth of crystal grain boundaries occurred. The collapse rate was about 27.9%.

Comparative Example 4

In the present comparative example, as the substrate treating liquid, instead of cyclohexane serving as the plastic crystalline material, 1, 1, 2, 2, 3, 3, 4-heptafluorocyclopentane serving as a sublimable substance was used. Except for that, as in example 1, the drying treatment on the silicon substrate was performed.

Figure 17:
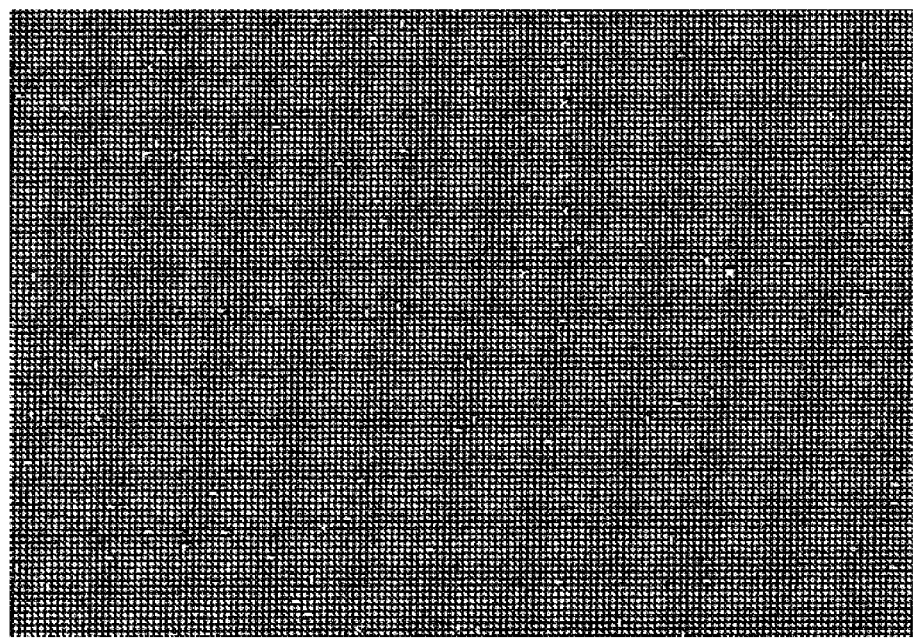
FIG. 17 is an SEM image showing a pattern-formed surface of a silicon substrate on which substrate processing in comparative example 4 was performed.

FIG. 17 is an SEM image of a region where the average collapse rate of the pattern was indicated in the silicon substrate after the procedures described above were performed (magnification: 10,000 times). It was confirmed that as compared with the pattern-formed surface (see FIG. 12) of the silicon substrate before the drying treatment, parts of white circles were partially observed, and that the collapse of the pattern occurred. The collapse rate was about 0.9%.

(Result)

As shown in FIGS. 13 to 17 and table 1, it is confirmed that in example 1 in which as the plastic crystalline material, cyclohexane was used, as compared with comparative examples 1 to 4 in which the conventional sublimable substance was used, it is possible to reduce the occurrence of the collapse of the pattern.

TABLE 1

|  | Substrate treating liquid | Collapse rate (%) |
| --- | --- | --- |
| Example 1 | Cyclohexane | 0.1 |
| Comparative example 1 | t-butanol | 52.3 |
| Comparative example 2 | Acetic acid | 99.1 |
| Comparative example 3 | p-xylene | 27.9 |
| Comparative example 4 | 1,1,2,2,3,3,4-heptafluorocyclopentane | 0.9 |

The present invention can be applied to dry technology for removing liquid adhered to the front surface of a substrate and substrate processing technology in general for processing the front surface of a substrate using the dry technology.

What is claimed is:

1. A substrate treating method of performing drying treatment on a pattern-formed surface of a substrate, the substrate treating method comprising:
a supplying step of supplying a substrate treating liquid containing a plastic crystalline material in a molten state to the pattern-formed surface of the substrate;
forming a plastic crystalline layer without bringing the substrate treating liquid into a solid state by cooling, under atmospheric pressure, the substrate treating liquid to a temperature equal to or higher than a temperature that is 5° C. lower than a freezing point of the plastic crystalline material in the molten state and is equal to or lower than the freezing point of the plastic crystalline material in the molten state and thereby forming a plastic crystalline layer by bringing, on the pattern-formed surface, the plastic crystalline material into a state of a plastic crystal being an intermediate phase between a solid state and a liquid state, being softer than the solid state and having fluidity; and
a removing step of removing the plastic crystalline layer from the pattern-formed surface by changing, under the atmospheric pressure, the plastic crystalline layer in the state of the plastic crystal into a gas state without passing through the solid state and the liquid state,
wherein, in the removing step, while the cooling in the forming of a plastic crystalline layer is being performed, the plastic crystalline layer is removed from the pattern-formed surface with the state of the plastic crystal maintained at the temperature equal to or higher than the temperature that is 5° C. lower than the freezing point of the plastic crystalline material in the molten state and is equal to or lower than the freezing point of the plastic crystalline material in the molten state.

2. The substrate treating method according to claim 1, wherein in at least any one of the plastic crystalline layer forming step and the removing step, a coolant is supplied toward a back surface on a side opposite to the pattern-formed surface of the substrate at a temperature which is equal to or higher than a temperature 5° C. lower than a freezing point of the plastic crystalline material and is equal to or lower than the freezing point of the plastic crystalline material.

3. The substrate treating method according to claim 1, wherein in at least any one of the plastic crystalline layer forming step and the removing step, a gas inert to at least the plastic crystalline material is supplied toward the pattern-formed surface at a temperature which is equal to or higher than a temperature 5° C. lower than a freezing point of the plastic crystalline material and is equal to or lower than the freezing point of the plastic crystalline material.

4. The substrate treating method according to claim 1, wherein in the removing step, a gas inert to at least the plastic crystalline material is supplied toward the pattern-formed surface at a temperature which is equal to or higher than a temperature 5° C. lower than a freezing point of the plastic crystalline material and is equal to or lower than the freezing point of the plastic crystalline material, and a coolant is supplied toward a back surface on a side opposite to the pattern-formed surface of the substrate at the temperature which is equal to or higher than the temperature 5° C. lower than the freezing point of the plastic crystalline material and is equal to or lower than the freezing point of the plastic crystalline material.

5. The substrate treating method according to claim 1, wherein the plastic crystalline material is cyclohexane.

6. The substrate treating method according to claim 3, wherein, in the removing step, the gas inert is supplied to the pattern-formed surface to remove the plastic crystalline layer while the state of the plastic crystal is being maintained at a pressure equal to or lower than a saturated vapor pressure of the plastic crystalline material.

7. The substrate treating method according to claim 4, wherein, in the removing step, the gas inert is supplied to the pattern-formed surface to remove the plastic crystalline layer while the state of the plastic crystal is being maintained at a pressure equal to or lower than a saturated vapor pressure of the plastic crystalline material.

* * * * *